(12) United States Patent
Fujiki et al.

(10) Patent No.: US 9,019,763 B2
(45) Date of Patent: Apr. 28, 2015

(54) NONVOLATILE SEMICONDUCTOR MEMORY DEVICE

(71) Applicant: Kabushiki Kaisha Toshiba, Tokyo (JP)

(72) Inventors: Jun Fujiki, Yokohama (JP); Yoshiaki Fukuzumi, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 13/778,730

(22) Filed: Feb. 27, 2013

(65) Prior Publication Data

US 2014/0085976 A1     Mar. 27, 2014

(30) Foreign Application Priority Data

Sep. 24, 2012  (JP) ................................ 2012-209485

(51) Int. Cl.
*G11C 16/04*    (2006.01)

(52) U.S. Cl.
CPC ....................................... *G11C 16/04* (2013.01)

(58) Field of Classification Search
None
See application file for complete search history.

(56) References Cited

U.S. PATENT DOCUMENTS

| 2009/0278193 A1 | 11/2009 | Murata et al. |
| 2010/0020608 A1 | 1/2010 | Kamigaichi et al. |
| 2011/0233646 A1 | 9/2011 | Mizushima et al. |
| 2013/0044549 A1 * | 2/2013 | Goda et al. ............... 365/185.26 |
| 2013/0248959 A1 * | 9/2013 | Matsumoto et al. .......... 257/314 |

FOREIGN PATENT DOCUMENTS

| JP | 2009-272513 | 11/2009 |
| JP | 2010-114153 | 5/2010 |
| JP | 2010-165794 | 7/2010 |
| JP | 2011-199177 | 10/2011 |
| JP | 2011-204856 | 10/2011 |

* cited by examiner

*Primary Examiner* — James G Norman
(74) *Attorney, Agent, or Firm* — Oblon, McClelland, Maier & Neustadt, L.L.P.

(57) ABSTRACT

This nonvolatile semiconductor memory device comprises a transistor string formed on a substrate and including a plurality of first transistors connected in series with each other. A first bit line is connected to a first end of the transistor string. A source line is connected to a second end of the transistor string. A memory string extends in a direction perpendicular to the substrate and comprises a plurality of nonvolatile memory transistors and a select transistor connected in series. Moreover, a part of the memory string is connected to a gate of the first transistor.

17 Claims, 34 Drawing Sheets

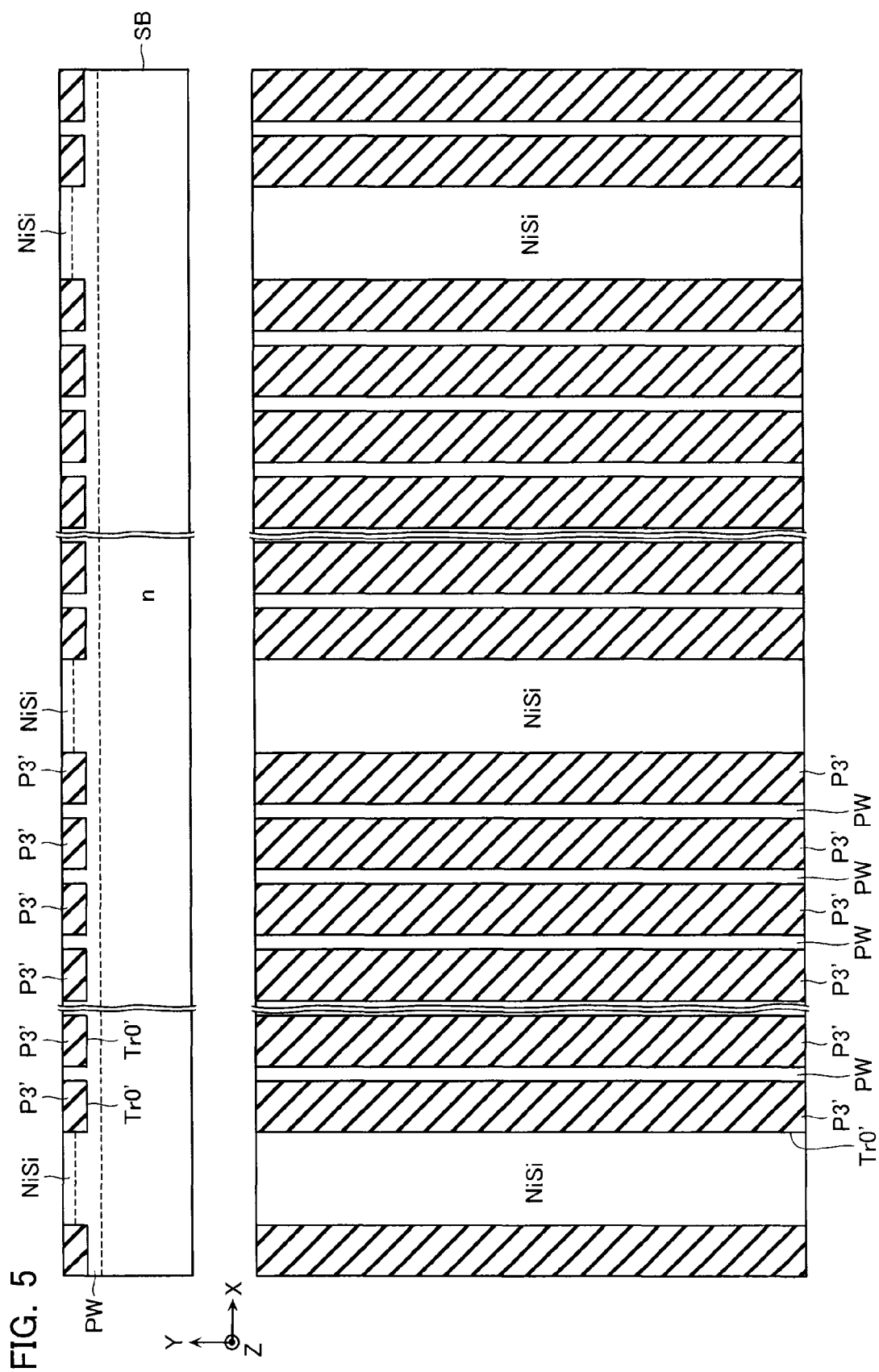

Cross-Section Along II-II'

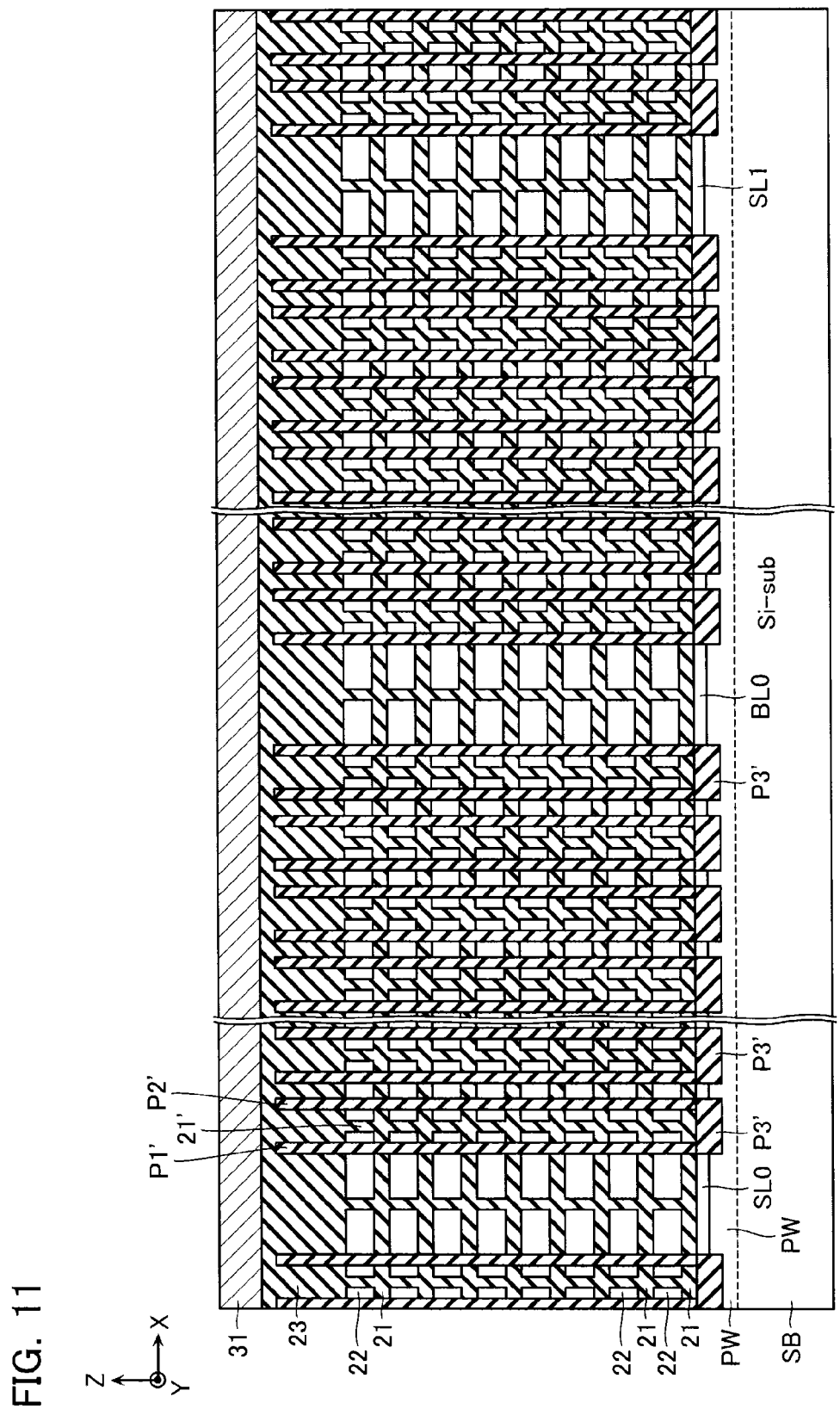

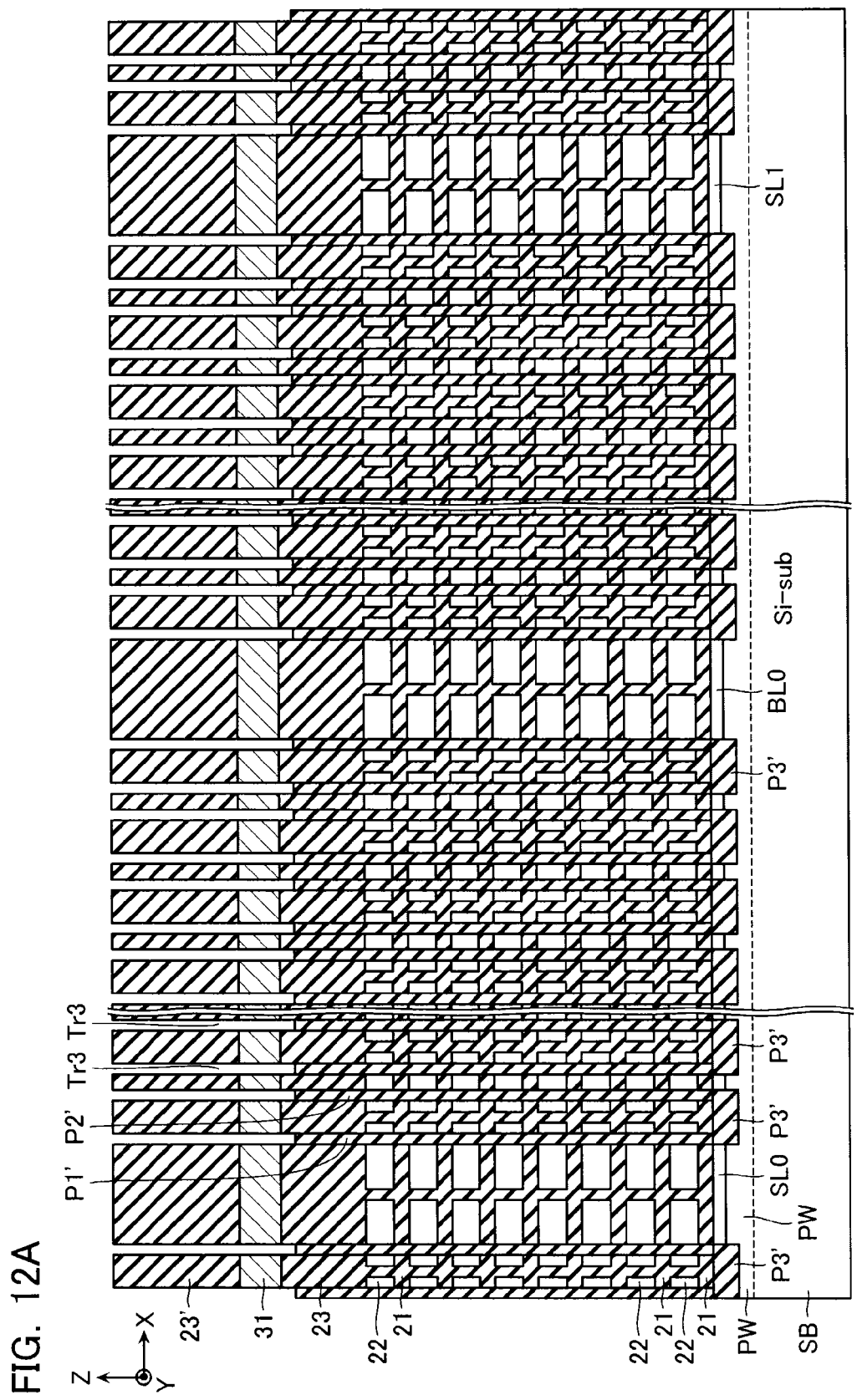

C Portion Enlarged

D Portion Enlarged

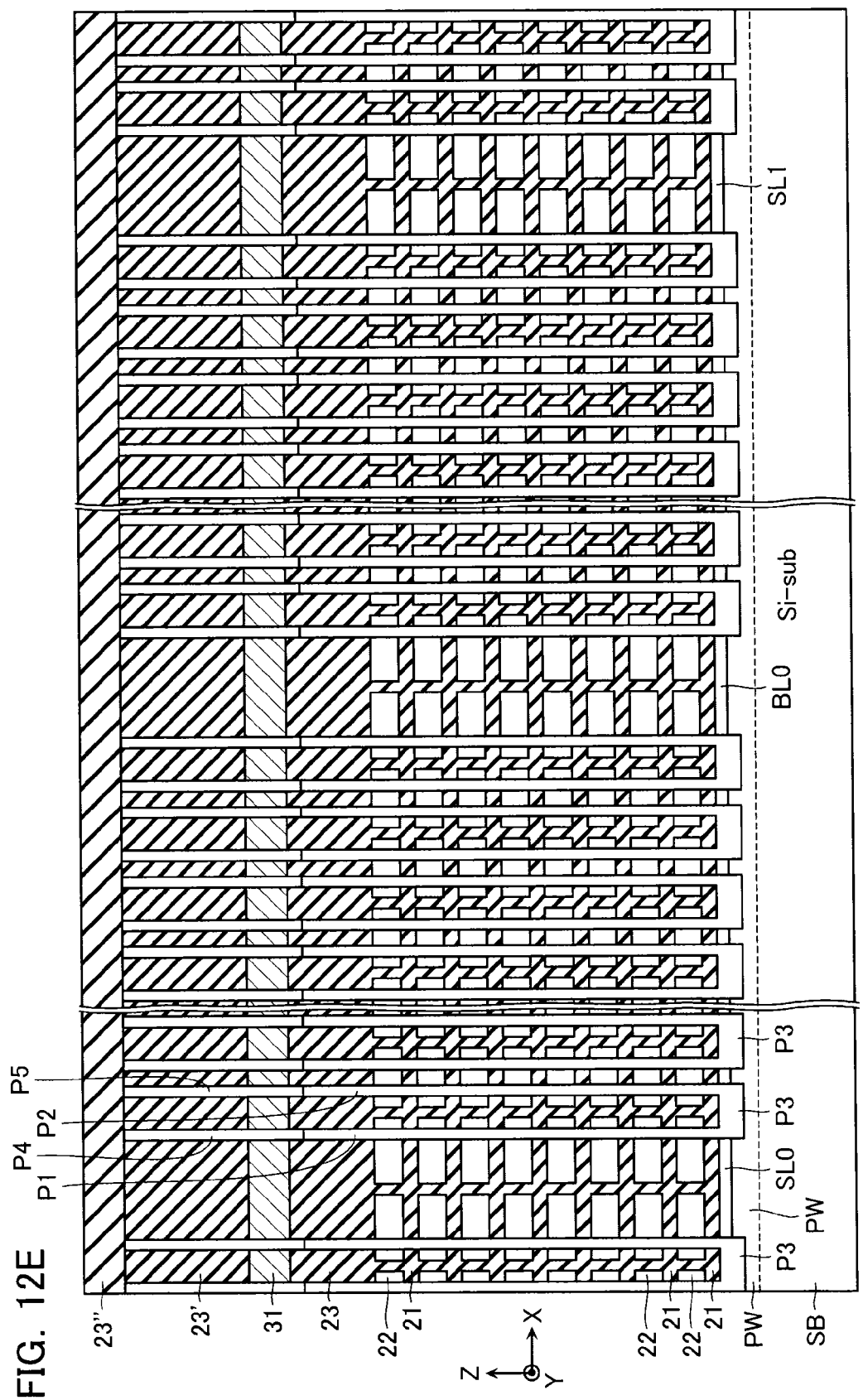

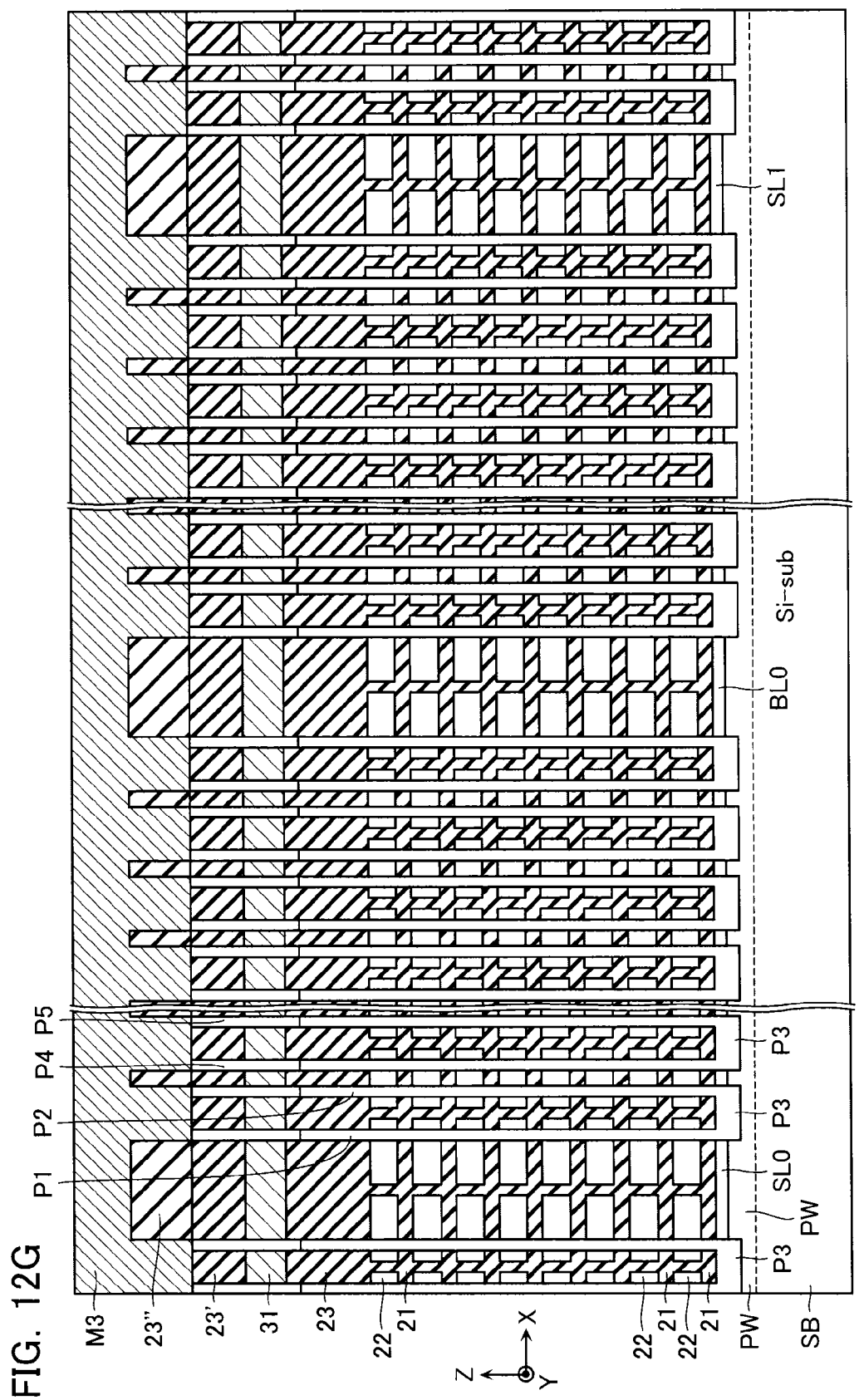

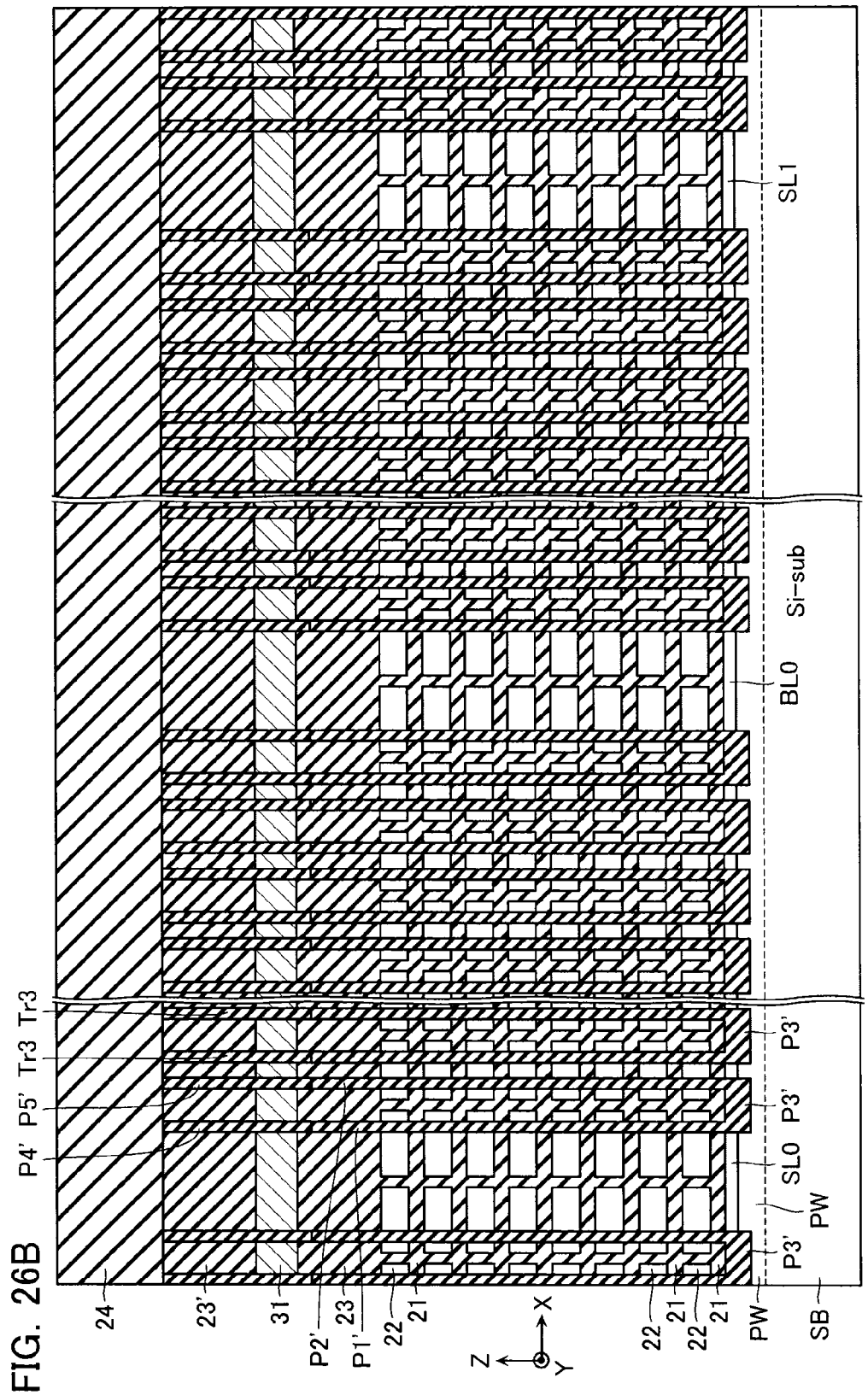

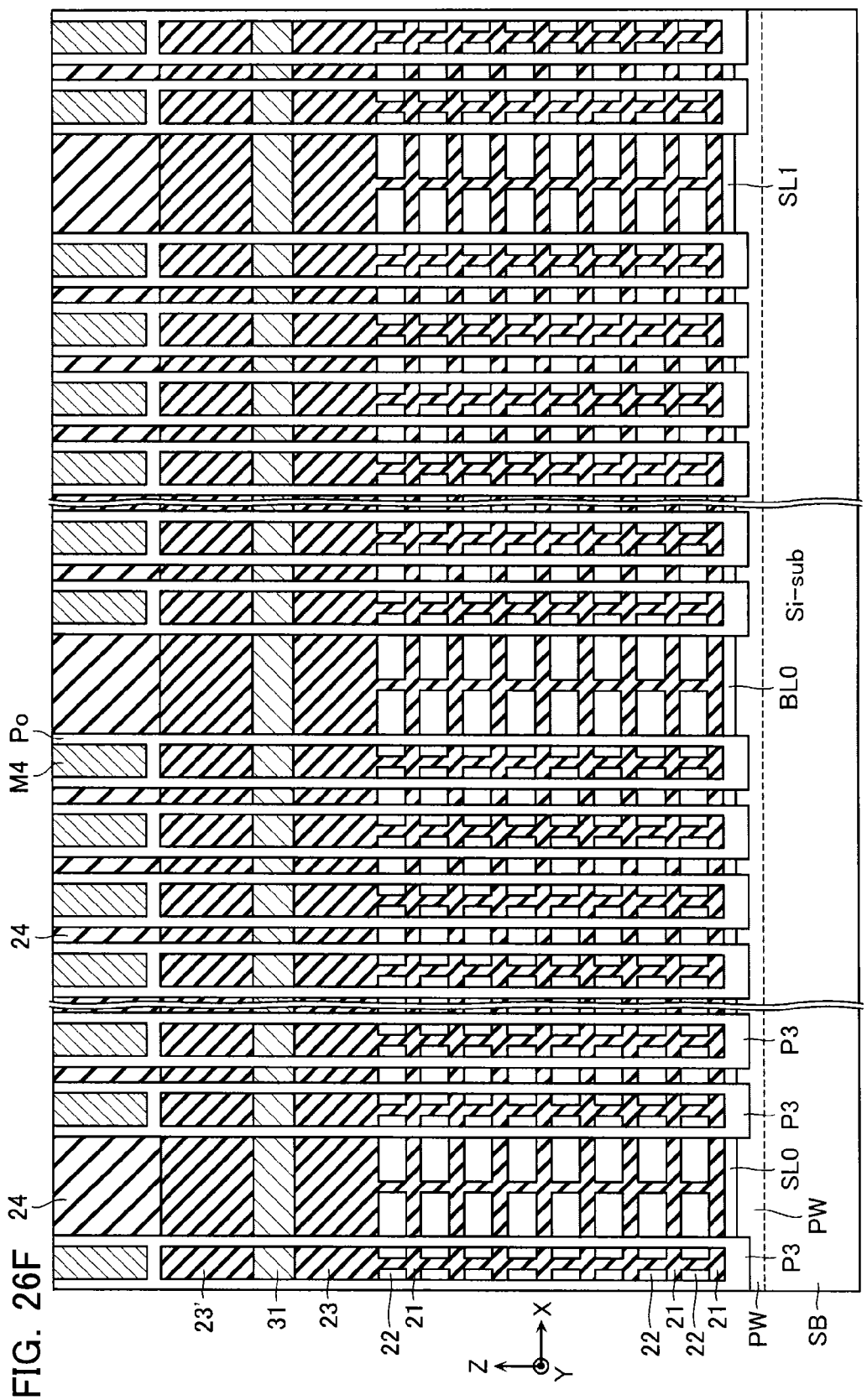

NONVOLATILE SEMICONDUCTOR MEMORY DEVICE

CROSS REFERENCE TO RELATED APPLICATIONS

This application is based on and claims the benefit of priority from prior Japanese Patent Application No. 2012-209485, filed on Sep. 24, 2012, the entire contents of which are incorporated herein by reference.

FIELD

Embodiments described in the present specification relate to a nonvolatile semiconductor memory device.

BACKGROUND

In nonvolatile semiconductor memory devices such as NAND type flash memory, improvement in bit density caused by miniaturization technology is reaching its limit. As a result, development of three-dimensional type memory devices having a plurality of memory transistors (memory cells) stacked in a direction perpendicular to a substrate, is being advanced.

One proposed example of such a three-dimensional type memory device is a stacked type NAND type flash memory employing a vertical transistor to configure the memory transistors. The stacked type NAND type flash memory includes: a memory string configured from a plurality of the memory transistors connected in series in a stacking direction; and a select transistor provided at both ends of the memory string.

Such a stacked type NAND type flash memory has a problem that as the number of memory transistors stacked increases and channel thickness or channel diameter of the memory transistors is reduced, a cell current (channel current) flowing in the memory string is also reduced, whereby execution of an accurate and fast read operation becomes difficult.

BRIEF DESCRIPTION OF THE DRAWINGS

FIG. 5 is a process diagram showing a method of manufacturing the nonvolatile semiconductor memory device 100 according to the first embodiment.

FIG. 11 is a process diagram showing the method of manufacturing the nonvolatile semiconductor memory device 100 according to the first embodiment.

FIG. 12A is a process diagram showing the method of manufacturing the nonvolatile semiconductor memory device 100 according to the first embodiment.

FIG. 12E is a process diagram showing the method of manufacturing the nonvolatile semiconductor memory device 100 according to the first embodiment.

FIG. 12G is a process diagram showing the method of manufacturing the nonvolatile semiconductor memory device 100 according to the first embodiment.

FIG. 26B is a process diagram showing the separate method of manufacturing a nonvolatile semiconductor memory device according to an embodiment.

FIG. 26F is a process diagram showing the separate method of manufacturing a nonvolatile semiconductor memory device according to an embodiment.

DETAILED DESCRIPTION

A nonvolatile semiconductor memory device in an embodiment described below comprises a transistor string formed on a substrate and including a plurality of first transistors connected in series with each other. A first bit line is connected to a first end of the transistor string. A source line is connected to a second end of the transistor string. A memory string extends in a direction perpendicular to the substrate and comprises a plurality of nonvolatile memory transistors and a select transistor connected in series. Moreover, a part of the memory string is connected to a gate of the first transistor. A word line is connected to a control gate of the memory transistor. A select gate line is connected to a control gate of the select transistor. A second bit line is connected to the memory string via the select transistor. A control unit controls the first bit line, the source line, the word line, the select gate line, and the second bit line.

Embodiments of a nonvolatile semiconductor memory device according to the present embodiment are described below with reference to the drawings.

[First Embodiment]
[Configuration]

Figure 1:
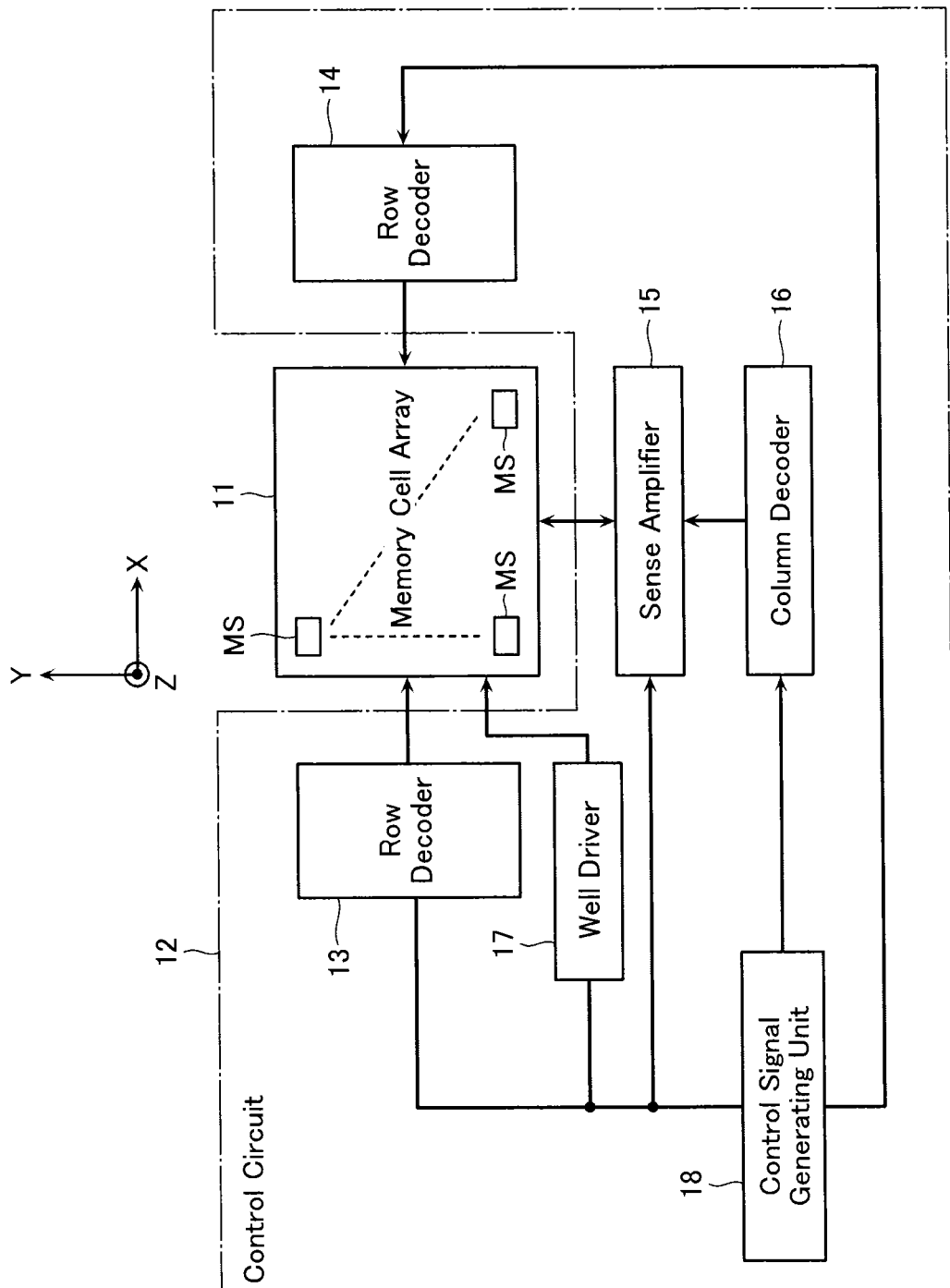
FIG. 1 is a block diagram describing a configuration of a nonvolatile semiconductor memory device 100 according to a first embodiment.

First, a configuration of a nonvolatile semiconductor memory device 100 according to a first embodiment is described with reference to FIG. 1. FIG. 1 is a block diagram of the nonvolatile semiconductor memory device according to the first embodiment.

As shown in FIG. 1, the nonvolatile semiconductor memory device according to the first embodiment includes a memory cell array 11 and a control circuit 12. The control circuit 12 controls various kinds of operations (a write operation, a read operation, an erase operation, and so on) on the memory cell array 11.

The memory cell array 11 is configured having memory transistors MT arranged three-dimensionally therein, each of the memory transistors MT configuring a nonvolatile memory cell. More specifically, memory strings MS, each formed having a plurality of the nonvolatile memory cells and a select transistor connected in series and extending in a direction perpendicular to a substrate, are arranged in a matrix in the memory cell array 11, whereby the memory transistors MT are arranged three-dimensionally. Moreover, formed on a surface of the substrate below the memory string MS is a transistor string TS (not illustrated in FIG. 1) to be mentioned later. Note that the memory cell array 11 is divided into blocks that are a smallest unit of the erase operation.

The control circuit 12 comprises row decoders 13 and 14, a sense amplifier 15, a column decoder 16, a well driver 17, and a control signal generating unit 18.

The row decoders 13 and 14 decode a received block address signal and row address signal to control the memory cell array 11. The sense amplifier 15 detects and amplifies a potential of a bit line BL in the memory cell array 11 to read data retained in the memory cell.

The column decoder 16 decodes a column address signal to control the sense amplifier 15. Moreover, the well driver 17 controls a voltage provided to a well PW to be mentioned later, the well PW being where the transistor string TS is formed. The control signal generating unit boosts a base voltage to generate a high voltage required during write and erase, and, moreover, generates a control signal to control the row decoders 13 and 14, the sense amplifier 15, the column decoder 16, and the well driver 17.

Figure 2:
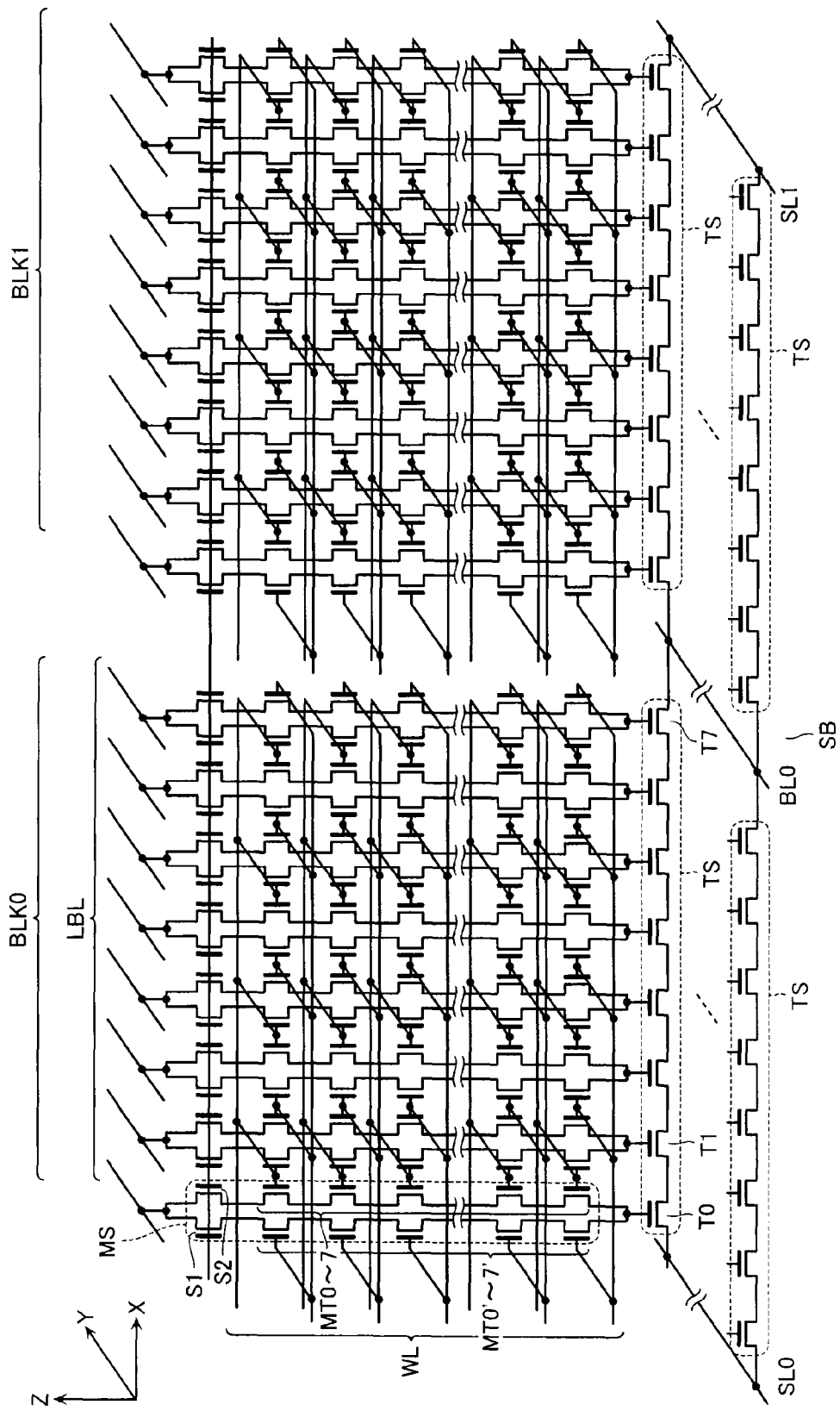
FIG. 2 is an equivalent circuit diagram of a memory cell array 11 in FIG. 1.

FIG. 2 is an equivalent circuit diagram of the memory Cell array 11. In FIG. 2, an X direction and a Y direction are directions parallel to a plane of the substrate, and a Z direction is a direction perpendicular to the plane of the substrate (stacking direction).

As previously mentioned, the memory cell array 11 is divided into blocks BLK that are the smallest unit of the erase operation. In FIG. 2, two blocks BLK0 and BLK1 are typically illustrated. All of the blocks BLK have an identical structure, hence only block BLK0 is described below.

A plurality of transistor strings TS are formed on a plane of a semiconductor substrate SB in the block BLK0, each of the transistor strings TS formed having a plurality of transistors T (first transistors) (here, the eight transistors T0~T7 connected in series therein. This transistor T may be configured to have a size larger than that of the memory transistor MT in the memory string MS. For example, if the memory string MS is formed with a size of 6 F (where F is a minimum processing dimension) in the X direction, then since the transistor T is formed immediately below the memory string MS, the transistor T can be formed with a size up to a maximum of 6 F. As a result, the transistor T is capable of allowing a larger current to flow than the memory transistor MT. The nonvolatile semiconductor memory device of the present embodiment includes a configuration for judging data retained in the memory transistor MT by a magnitude of current flowing in this transistor string TS. Therefore, in the present embodiment, read current can be increased and a read operation can be executed rapidly and accurately, compared to the case of a conventional stacked NAND type flash memory.

The plurality of transistor strings TS are formed having the X direction as a long direction and are arranged aligned in the Y direction. These plurality of transistor strings TS have their one ends connected to a bit line BL (first bit line). Moreover, the transistor strings TS have their other ends connected to a source line SL. In the example of FIG. 2, the bit line BL is arranged having the Y direction as a long direction, moreover, a single bit line BL is commonly connected to the one ends of the plurality of transistor strings TS. Similarly, the source line SL also is arranged having the Y direction as a long direction. Moreover, a single source line SL is commonly connected to the other ends of the plurality of transistor strings TS in one block BLK. Note that the bit line BL is connected to the previously mentioned sense amplifier 15, and the sense amplifier 15 detects and amplifies a voltage of this bit line BL.

A body (channel portion) of the memory string MS is connected to the control gate of this transistor T. The body (channel portion) of the memory string MS functions as the control gate of the transistor T. The memory string MS comprises a plurality of the memory transistors MT and a select transistor S connected in series. The memory strings MS are arranged in a matrix in an XY plane in one block BLK and having the Z direction as a long direction (in FIG. 2, for simplification of the drawing, only eight memory strings MS aligned in the X direction are illustrated).

The memory string MS is configured having the plurality of memory transistors MT (memory cells) connected in series. As shown in FIG. 2, this memory string MS of FIG. 2 is configured having two columns of series-connected circuits each of which comprise eight of the memory transistors MT and a select transistor S1 (or S2), further connected in parallel. The memory string MS has a single sub-bit line LBL (second bit line) connected to its one end (drains of the select transistors S1 and S2), and has the control gate of the transistor T connected to its other end. The sub-bit lines LBL are arranged having the Y direction in FIG. 2 as a long direction. A single sub-bit line LBL is commonly connected to the plurality of memory strings MS (select transistors S1 and S2) aligned in the Y direction. As will be described later, the sub-bit line LBL is a wiring line for charging (pre-charging) the body of the memory string MS in a stage before a data read operation from the memory transistor MT.

In addition, the plurality of memory transistors MTi (MTi') (i=0~7) in an identical block BLK are commonly connected to a word line WLi (or WLi'). As will be described later, the memory transistor MT is a nonvolatile memory cell (flash memory cell) capable of having its retained data changed according to an amount of charge stored in a charge storage film provided in a gate insulating film.

Figure 3A:
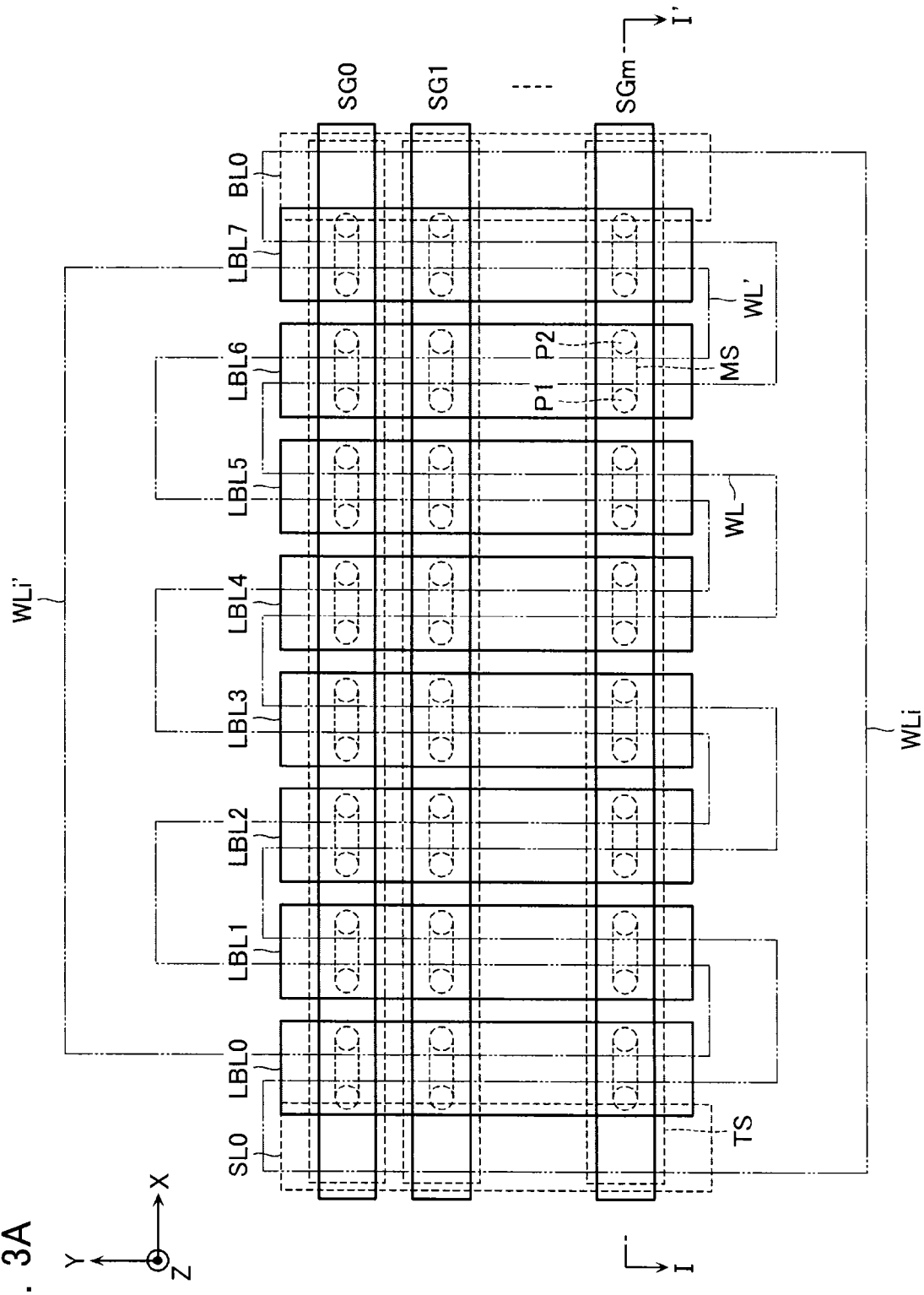
FIG. 3A is a plan view layout diagram describing a specific structure of one block BLK in the memory cell array 11.
Figure 3B:
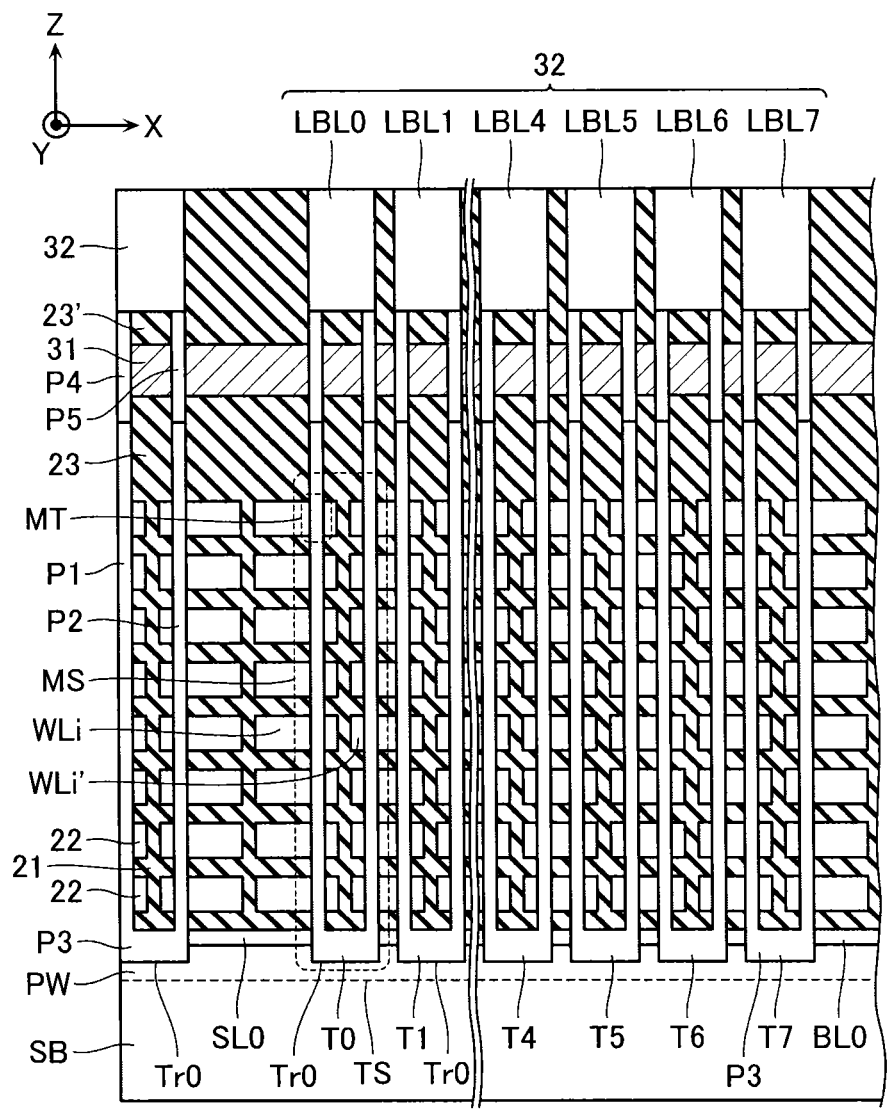
FIG. 3B is a cross-sectional view taken along the line I-I' in FIG. 3A.
Figure 4:
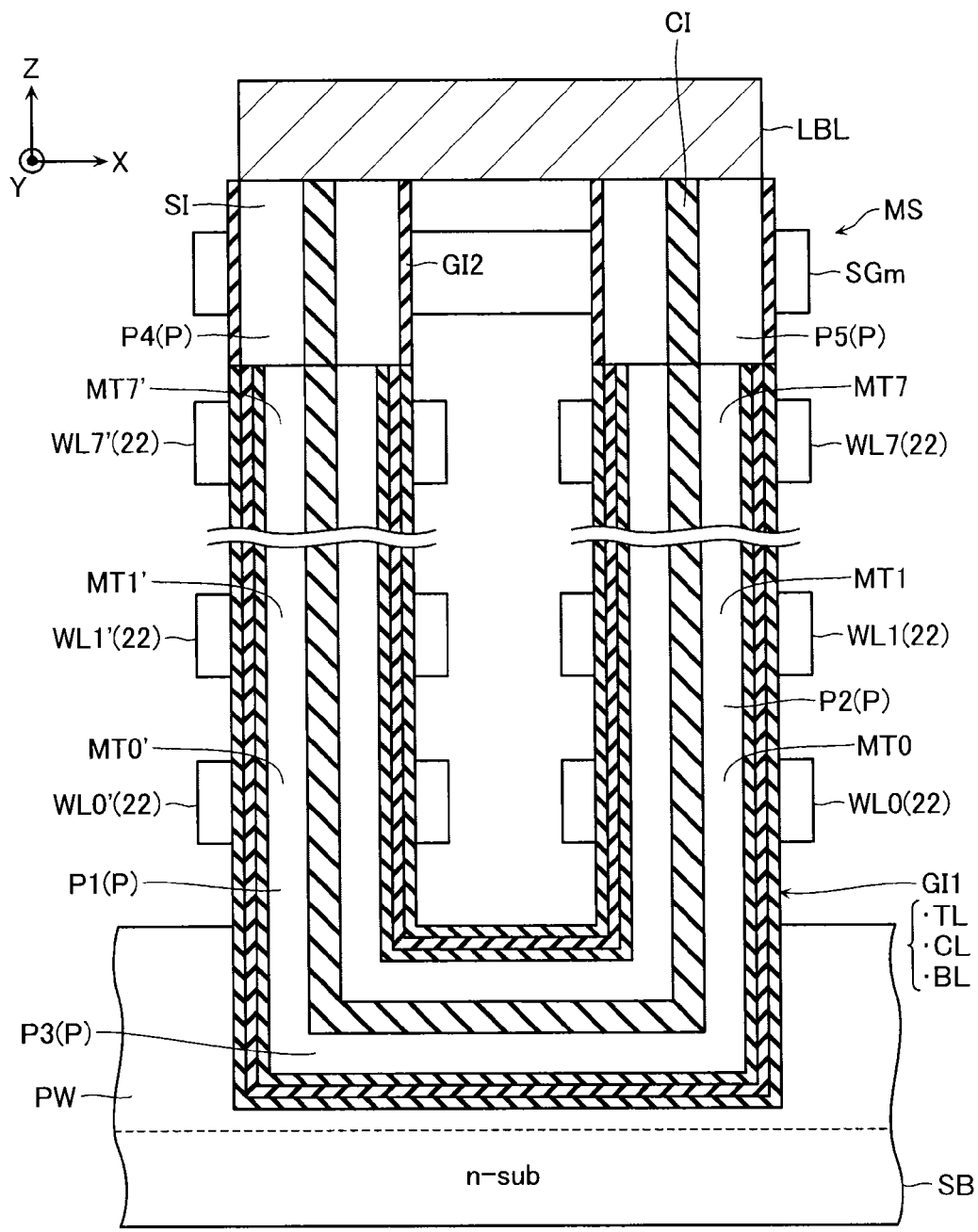
FIG. 4 is an enlarged cross-sectional view of one memory string MS.

Next, a specific structure of the memory cell array 11 in FIG. 2 is described with reference to FIGS. 3A and 3B and FIG. 4. FIG. 3A is a plan view layout diagram describing a specific structure of one block BLK0 in the memory cell array 11, and FIG. 3B is a cross-sectional view taken along the line I-I' in FIG. 3A. Moreover, FIG. 4 is an enlarged cross-sectional view of one memory string MS. Note that although a configuration of the block BLK0 is described here, the other blocks BLK also have a similar structure.

As shown in FIG. 3A, eight sub-bit lines LBL0~LBL7 are arranged in one block BLK at equal intervals in the X direction and having the Y direction as a long direction. The plurality of memory strings MS (shown by broken lines in FIG. 3A) are arranged in a matrix below these sub-bit lines LBL0~LBL7.

Moreover, formed further below these memory strings MS and having the X direction as a long direction are the previously mentioned transistor strings TS. The transistors T0~T7 included in the transistor strings TS are formed on a surface of the semiconductor substrate SB.

The word lines WLi and WLi' (i=0~7) have a comb-shaped form commonly connecting the memory transistors MTi or MTi' in one block BLK0. In one block BLK0, two comb-shaped word lines WLi and WLi' face each other arranged in a form such that their comb tooth portions mesh with each other.

In addition, the bit line BL0 and the source line SL0 are formed on a surface of the n type semiconductor substrate SB and at both of left and right ends of one block BLK0. The bit line BL0 and the source line SL0 may be formed by, for example, a silicide. Specifically, the bit line BL0 and the source line SL0 may be formed by a nickel silicide film formed by first depositing a metal such as nickel on the surface of the semiconductor substrate SB by sputtering, and then annealing. It is also possible to form the bit line BL0 and the source line SL0 by forming an ordinary metal film by a damascene method or the like.

The transistors T0~T7 forming the transistor string TS are formed between these bit line BL0 and source line SL0. The transistors T0~T7 are each a p type MOSFET. The reason for adopting a p type MOSFET as the transistor T is because, in order to pre-charge the body of the memory string MS, it is required that the transistor T be a p type MOSFET rather than an n type MOSFET.

As shown in FIG. 3B, the p type well PW is formed on the semiconductor substrate SB, and a trench Tr0 is further formed on this p type well PW. A linking portion P3 configuring part of the memory string MS is embedded in this trench Tr0 via a gate insulating film GI1' (not illustrated in FIG. 3B). The linking portion P3 of the memory string MS is formed by, for example, polysilicon. The linking portion P3 functions as a channel of the memory string MS, functions also as a gate electrode of the transistors T0~T7.

As shown in FIG. 3B, the memory string MS comprises: the aforementioned linking portion P3; pillar portions P1 and P2 extending along the Z direction (stacking direction) from both ends of this linking portion P3; and pillar portions P4 and P5 further extending along the Z direction from upper ends of these pillar portions P1 and P2. The pillar portions P1, P2, P4, and P5 also may be formed by an identical material to the linking portion P3 (for example, polysilicon), and a body P of the memory string MS is formed by the pillar portions P1, P2, P4, and P5, and the linking portion P3.

As shown in FIG. 3B, a plurality of conductive layers 22 are formed surrounding a periphery of the body P, and these conductive layers 22 function as the aforementioned word lines WLi and WLi' (i=0~7). An interlayer insulating film 21 is embedded between the plurality of conductive layers 22. The word lines WLi and WLi' have a comb-shaped form as shown in FIG. 3A. Note that the reason for the word lines WLi and WLi' having a comb-shaped form is in order to reduce the number of contacts to the word lines WLi and WLi'. The word lines WLi and WLi' may also be formed individually to each memory cell, for example, rather than in a comb-shaped form. Moreover, in the example of FIGS. 3A and 3B, one comb tooth portion of the comb tooth-shaped word lines WLi and WLi' is formed straddling two of the memory strings MS. However, this is merely an example, and a single comb tooth portion of the word lines WLi or WLi' may also be provided to each single pillar portion P1 or P2.

A conductive layer 31 is formed in a layer above the conductive layers 22 via an interlayer insulating film 23. The conductive layer 31 functions as a select gate line SGm. As shown in FIG. 3A, the conductive layers 31 (select gate lines SG) are formed having the X direction as a long direction and are arranged at equal intervals in the Y direction.

A single conductive layer 32 is formed on upper ends of a single pair of pillar portions P4 and P5. The conductive layers 32 are wiring lines functioning as the sub-bit line LBL, and are formed at equal intervals in the X direction and having the Y direction as a long direction.

The structure of the memory string MS is described in further detail with reference to FIG. 4. As previously mentioned, the memory string MS comprises the body P, and the body P comprises the pillar portions P1, P2, P4, and P5, and the linking portion P3. The body P is formed as follows. First, memory gate insulating films GI1 and GI2 are formed on an inner wall of a trench formed penetrating the interlayer insulating film 21, the conductive layers 22 and the semiconductor substrate SB. Then, the trench is filled with polysilicon. Note that the body P includes a hollow portion in a vicinity of its central axis, and that that hollow portion is embedded with an insulating film CI. This insulating film CI may also be omitted.

The memory gate insulating film GI1 functions as a gate insulating film of the memory transistor MT, and has a three layer structure of a tunnel insulating film TL, a charge storage film CL, and a block insulating film BL, sequentially from an inner side of the trench. The tunnel insulating film TL and the block insulating film BL are configured from a silicon oxide film (SiO2). The charge storage film CL is configured from, for example, a silicon nitride film having a charge storage function. Retained data of the memory transistor MT (memory cell) changes according to an amount of charge stored in this charge storage film CL.

Next, a method of manufacturing the nonvolatile semiconductor memory device according to the first embodiment is described with reference to FIGS. 5-12.

First, as shown in FIG. 5, ion implantation of boron (B) is performed on the n type semiconductor substrate SB to form the p type well PW. Then, trenches Tr0' are formed in a striped shape on this p type well PW. The trenches Tr0' are formed aligned in the X direction and having the Y direction as a long direction.

Then, a sacrifice film P3' formed of a silicon nitride film is embedded in this trench Tr0'. The sacrifice film P3' is later stripped off, and is formed only until the trench Tr0' is embedded instead by a material that forms a final structure. Various well-known methods may be adopted for embedding the sacrifice film P3' (silicon nitride film) in the trench Tr0'. As an example, a silicon oxide film is first formed on an entire surface of the semiconductor substrate SB, and then the trench Tr0' is formed via that silicon oxide film. A silicon nitride film is formed on an entire surface of the semiconductor substrate SB including inside this trench Tr0', and then CMP (Chemical Mechanical Polishing) using the silicon oxide film as a stopper is executed to remove the silicon nitride film on an outside of the trench Tr0' (note that, for example, RIE or the like may be employed instead of CMP as a method of removing the silicon nitride film).

Then, wet etching is executed to remove the silicon oxide film, whereby a shape in FIG. 5 can be obtained. Note that in a portion where the bit line BL and the source line SL are formed, nickel (Ni) is deposited by sputtering. Then, annealing treatment is executed, thereby forming a nickel silicide film (NiSi) that is to be the bit line BL and the source line SL. This sputtering and annealing process may be performed either before or after formation of the sacrifice film P3'. Moreover, it is also possible for the bit line BL and the source line SL to be formed by a process of implantation and activation of an impurity such as boron, instead of the above-mentioned sputtering and annealing process.

Figure 6A:
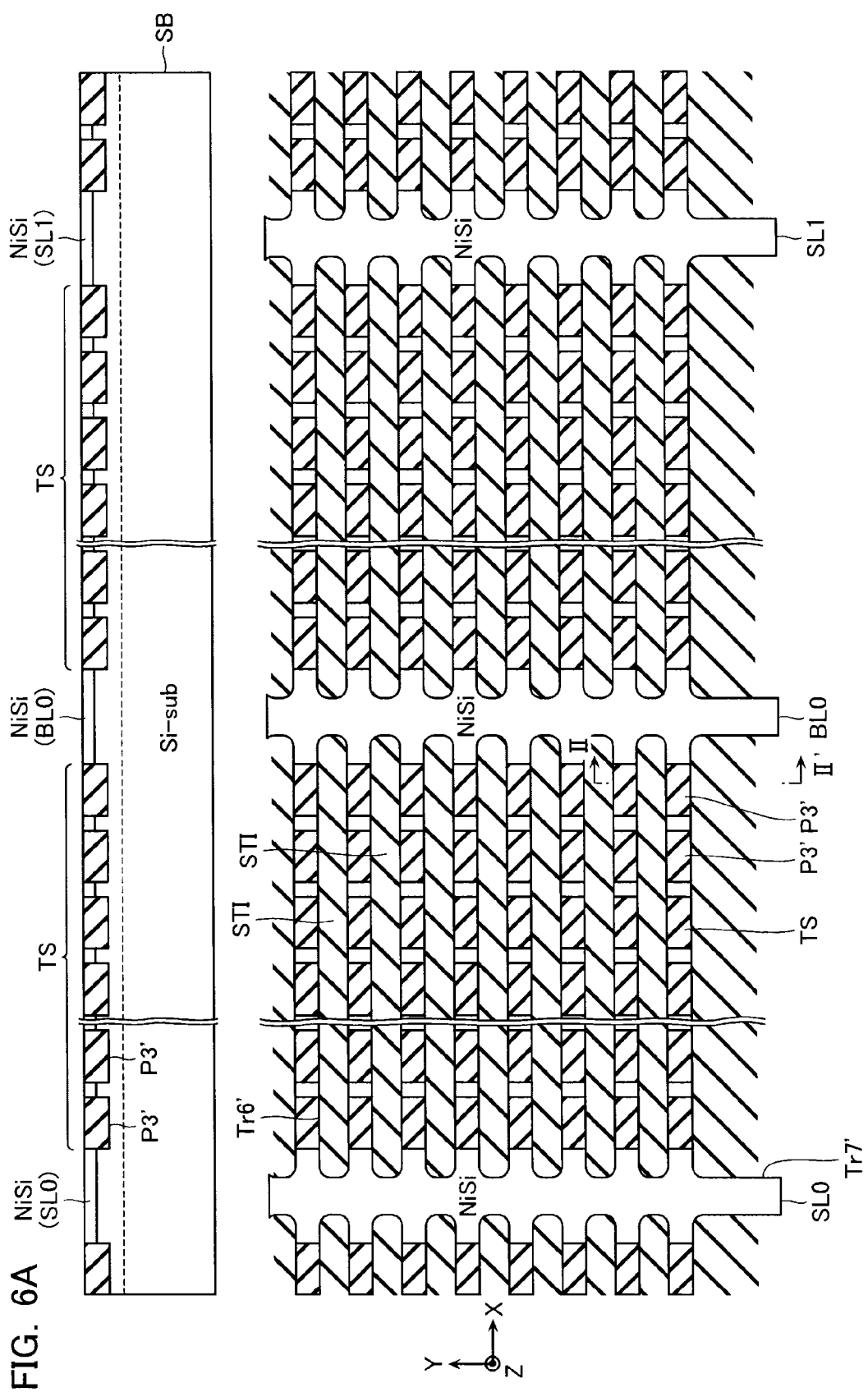
FIG. 6A is a process diagram showing the method of manufacturing the nonvolatile semiconductor memory device 100 according to the first embodiment.
Figure 6B:
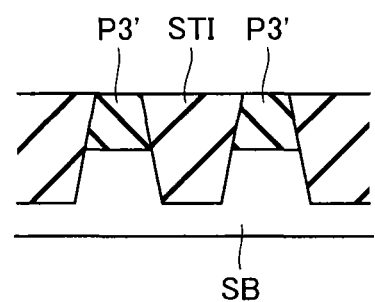
FIG. 6B is a process diagram showing the method of manufacturing the nonvolatile semiconductor memory device 100 according to the first embodiment.

Then, as shown in FIG. 6A, RIE (Reactive Ion Etching) is executed to perform etching of the sacrifice film P3' and the semiconductor substrate SB, whereby trenches Tr6' and Tr7' are formed. The trench Tr6' is formed having the X direction as a long direction. An element isolation insulating film STI configured from a silicon oxide film is embedded in the trenches Tr6' and Tr7' using a CVD method or the like (refer to FIG. 6B which is a cross-sectional view taken along the line II-II' in FIG. 6A). The sacrifice film P3' is left in a matrix in regions sandwiched by the element isolation insulating film STI embedded in the trenches Tr6' and Tr7'. In other words, after execution of subsequent processes, a stripe-shaped surface of the semiconductor substrate SB isolated by the trenches Tr6' and Tr7' becomes the previously-mentioned transistor string TS. This matrix-shaped sacrifice film P3' is later removed and, in its place, polysilicon for configuring the previously mentioned linking portion P3 is embedded via the gate insulating film GI1.

Figure 7:
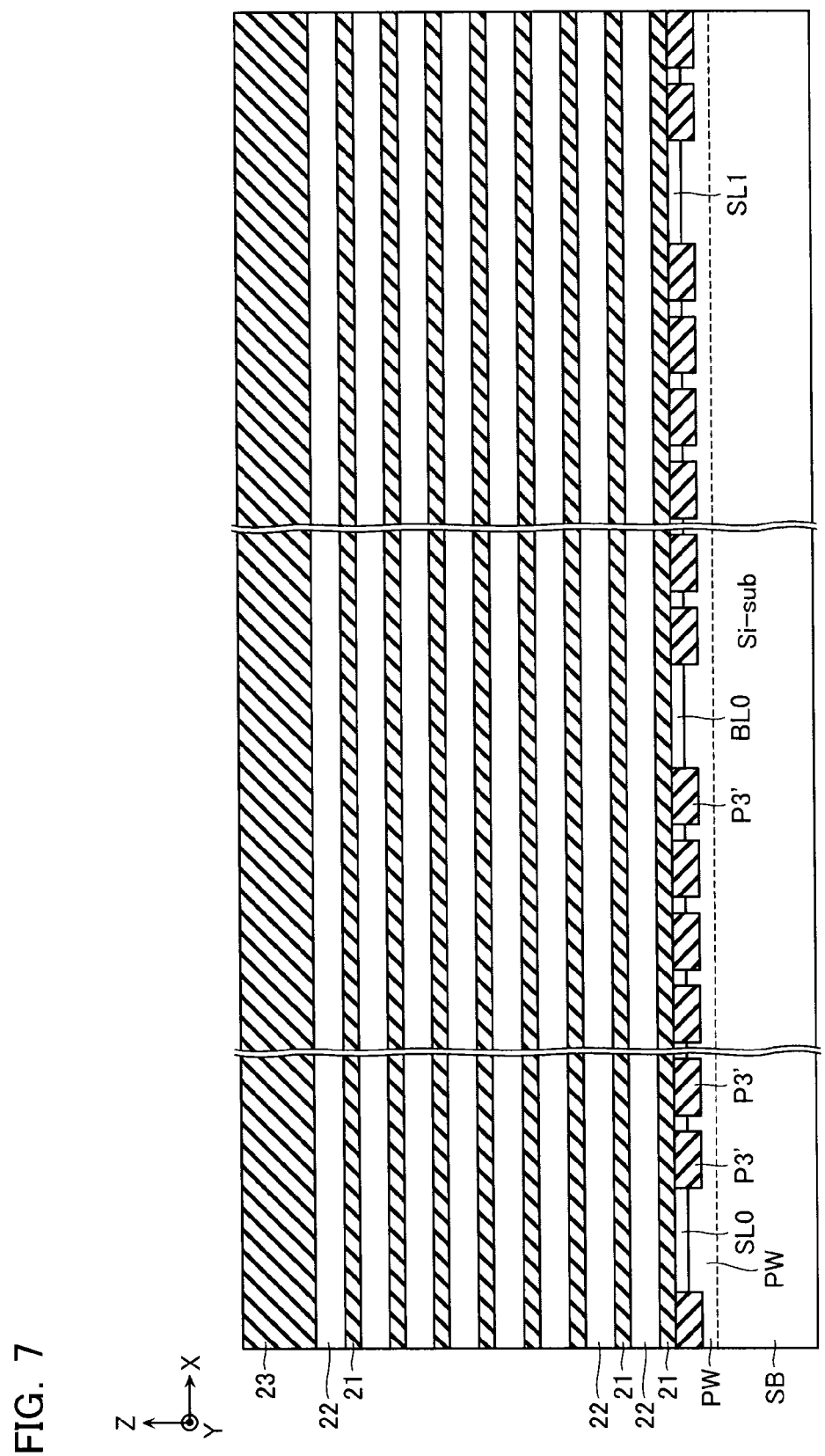
FIG. 7 is a process diagram showing the method of manufacturing the nonvolatile semiconductor memory device 100 according to the first embodiment.

Next, as shown in FIG. 7, the interlayer insulating film 21 and the conductive layers 22 are formed alternately in a plurality of layers on an entire upper surface of the semiconductor substrate SB. An interlayer insulating film 23 is further deposited in a layer above the uppermost conductive layer 22.

Figure 8:
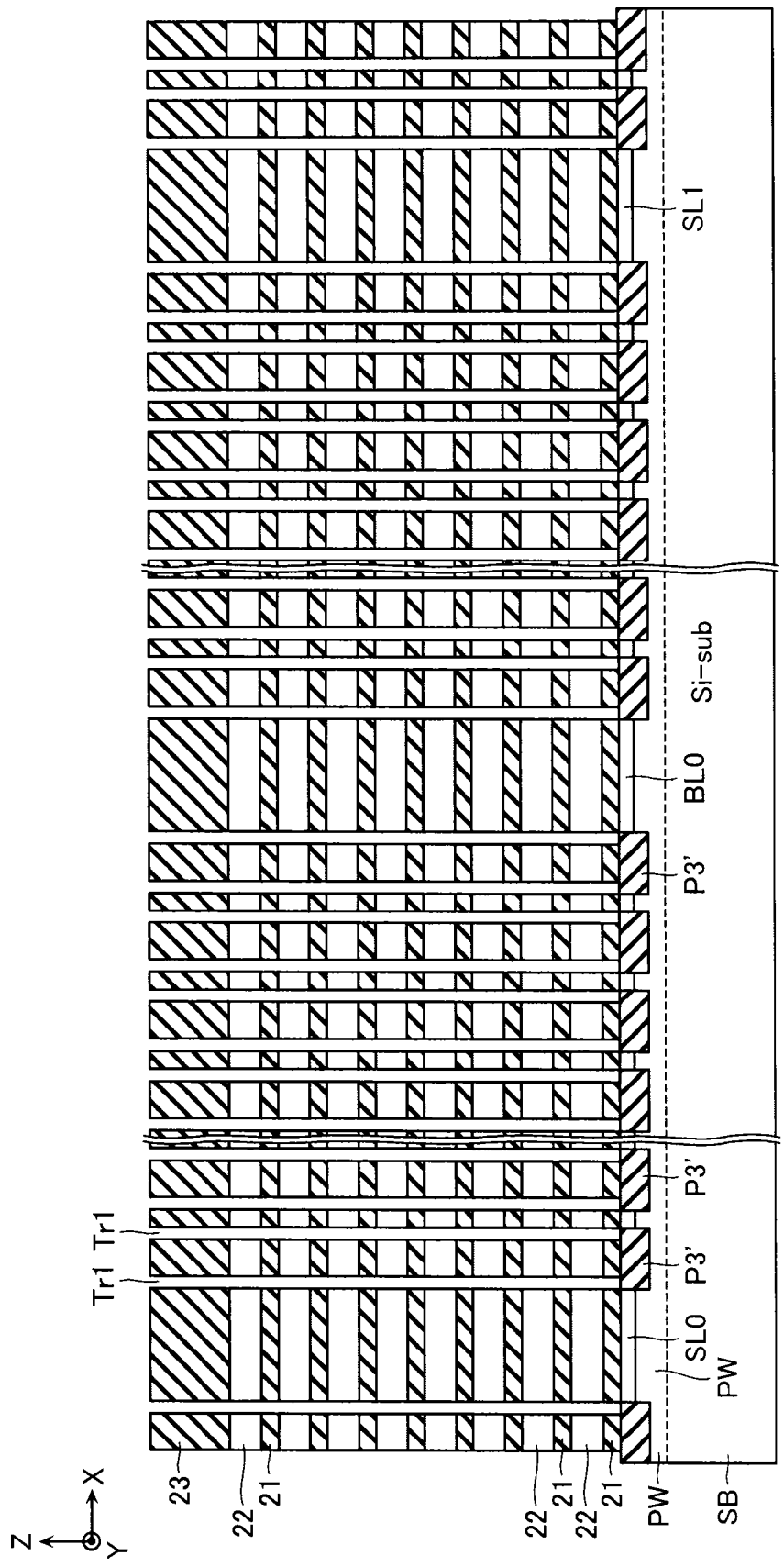
FIG. 8 is a process diagram showing the method of manufacturing the nonvolatile semiconductor memory device 100 according to the first embodiment.
Figure 9:
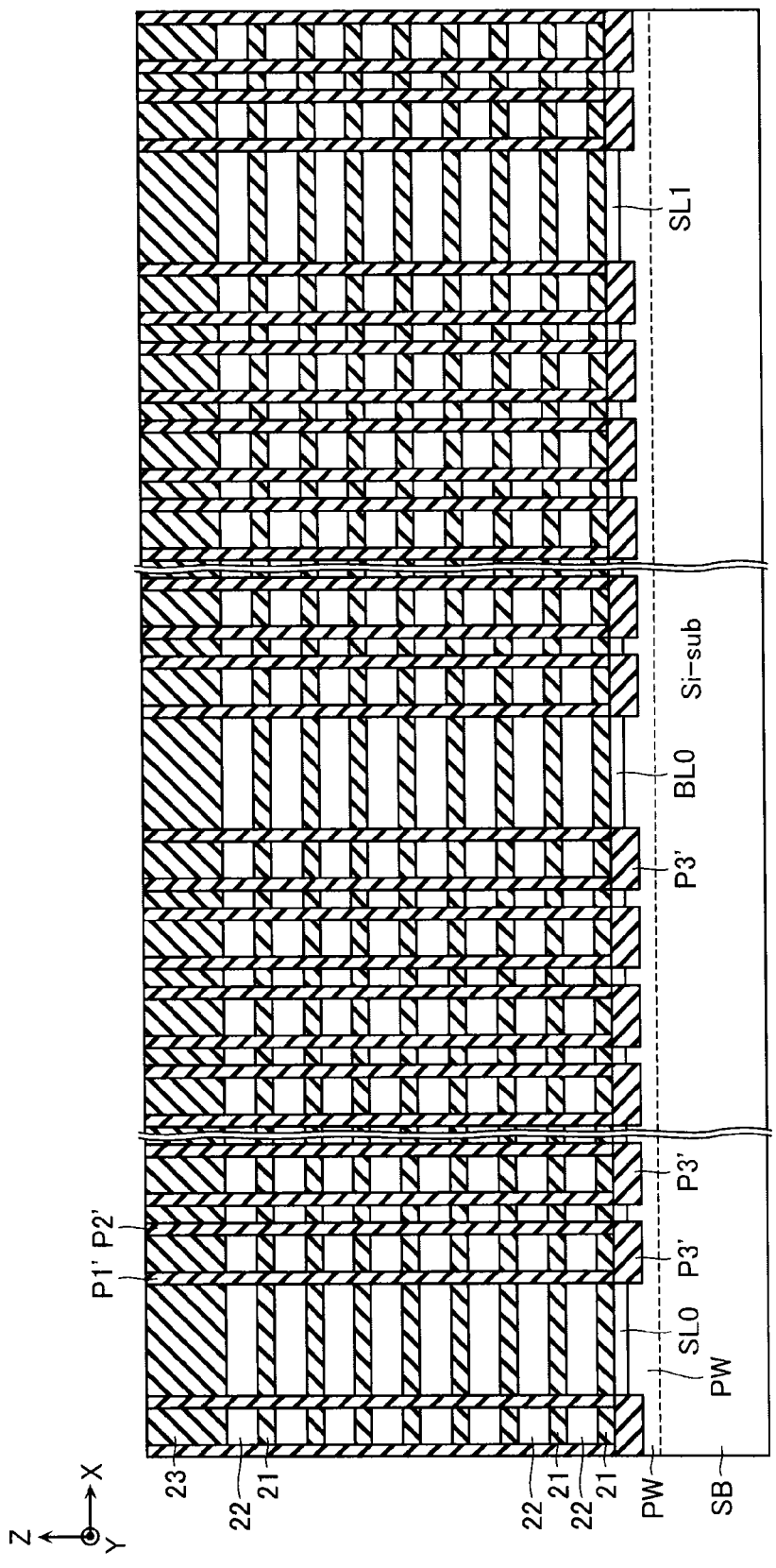
FIG. 9 is a process diagram showing the method of manufacturing the nonvolatile semiconductor memory device 100 according to the first embodiment.

Then, as shown in FIG. 8, a trench Tr1 is formed, the trench Tr1 penetrating the interlayer insulating films 21, the conductive layers 22, and the interlayer insulating film 23 to reach both ends of the sacrifice film P3'. As shown in FIG. 9, an inside of this trench Tr1 is embedded with sacrifice films P1' and P2' configured from a silicon nitride film.

Figure 10:
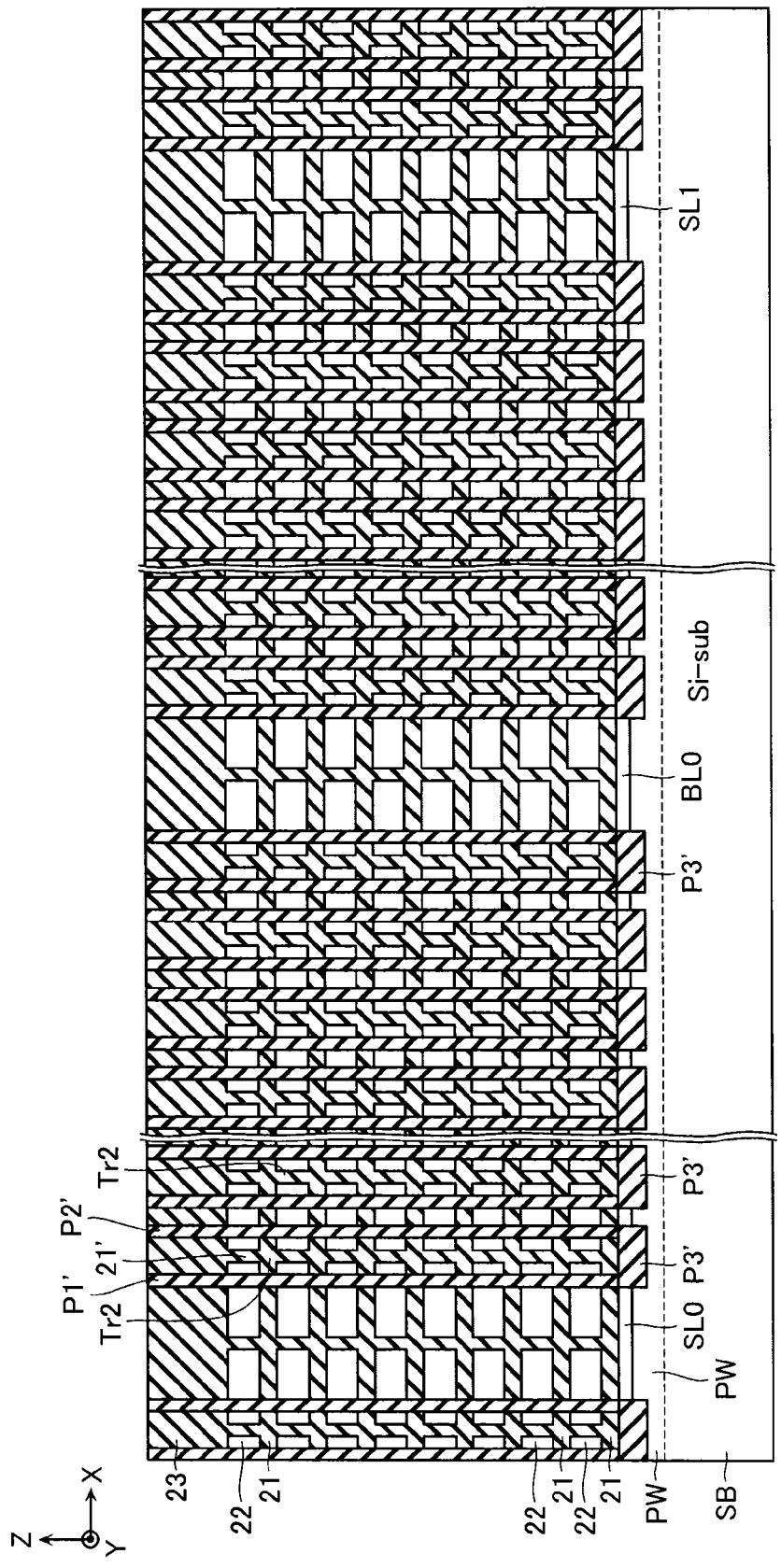
FIG. 10 is a process diagram showing the method of manufacturing the nonvolatile semiconductor memory device 100 according to the first embodiment.

Next, as shown in FIG. 10, a trench Tr2 penetrating The interlayer insulating films 21, the conductive layers 22, and the interlayer insulating film 23 is formed between the sacrifice films P1' and P2', and an interlayer insulating film 21' is formed by filling that trench Tr2 with a silicon oxide film. This step causes the word lines WLi and WLi' to be formed in a comb-tooth shape.

Then, as shown in FIG. 11, after supplementing the interlayer insulating film 23, a conductive layer 31 is formed on an entire upper surface of the interlayer insulating film 23. The conductive layer 31 is a wiring line which is to be the select gate line SG, hence, although not illustrated in FIG. 11, the conductive layer 31 is configured in a plurality of stripes aligned in the Y direction and having the X direction as a long direction, by executing RIE.

Figure 12B:
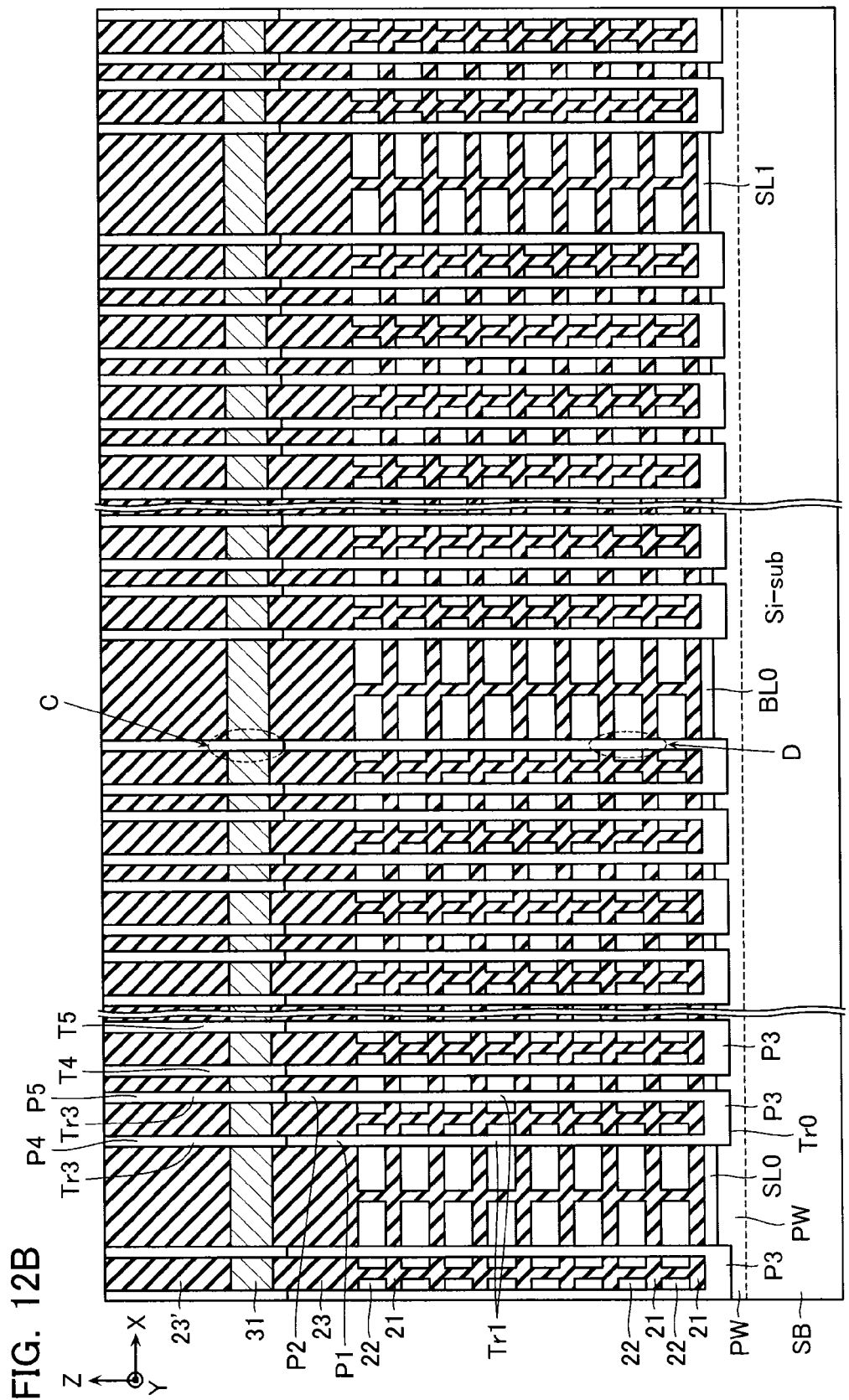
FIG. 12B is a process diagram showing the method of manufacturing the nonvolatile semiconductor memory device 100 according to the first embodiment.

Furthermore, as shown in FIG. 12A, after depositing an interlayer insulating film 23' on this conductive layer 31, a trench Tr3 reaching upper ends of the sacrifice films P1' and P2' is formed. Then, as shown in FIG. 12B, after removing the sacrifice layers P1', P2', and P3' by anisotropic etching, the gate insulating film GI1 is formed on a side surface of the trenches Tr0 and Tr1. Then, polysilicon forming the pillar portions P1 and P2 and the linking portion P3 is embedded inside the trenches Tr0 and Tr1.

Figure 12C:
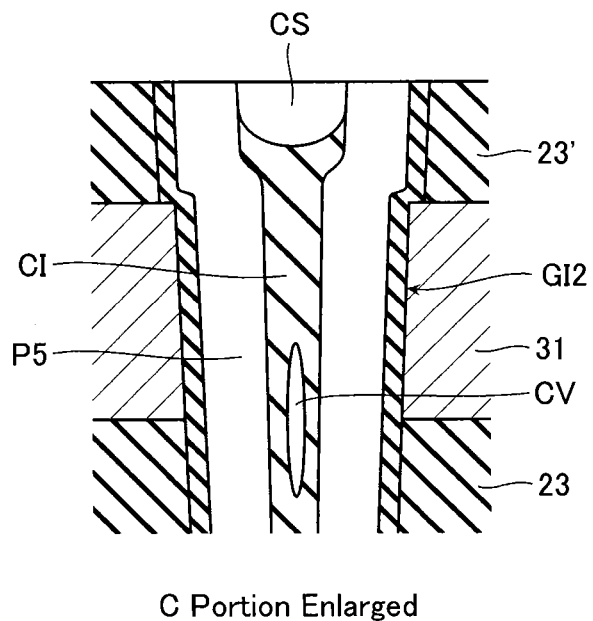
FIG. 12C is a process diagram showing the method of manufacturing the nonvolatile semiconductor memory device 100 according to the first embodiment.
Figure 12D:
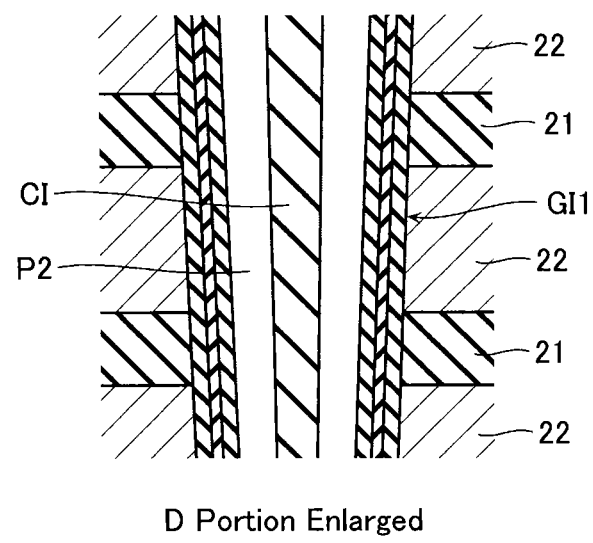
FIG. 12D is a process diagram showing the method of manufacturing the nonvolatile semiconductor memory device 100 according to the first embodiment.

Then, the gate insulating film GI2 is formed on a side surface of the trench Tr3. Then, polysilicon forming the pillar portions P4 and P5 is embedded inside the trench Tr3. In the case of forming a hollow in a central vicinity of the pillar portions P1, P2, P3 and P4, and the linking portion P3, this hollow is embedded with the insulating film CI configured from a silicon oxide film (refer to FIGS. 12C and 12D. FIG. 12C is an enlarged view of a vicinity of symbol C in FIG. 12B, and FIG. 12D is an enlarged view of a vicinity of symbol D in FIG. 12B). The insulating film CI may also be omitted, without forming the hollow. Moreover, this hollow may be left as a hollow, without filling it with the insulating film CI. In addition, as shown in FIG. 12C, a separate hollow portion CV may be further formed inside the insulating film CI.

Moreover, as shown in FIG. 12C, in order to improve electrical contact between the sub-bit line LBL and the pillar portions P4 or P5, a contact portion CS formed by etching back the insulating film CI is formed at a top portion of the pillar portions P4 or P5. The contact portion CS may be configured by, for example, silicon to which an impurity (phosphorus or the like) has been added.

Figure 12F:
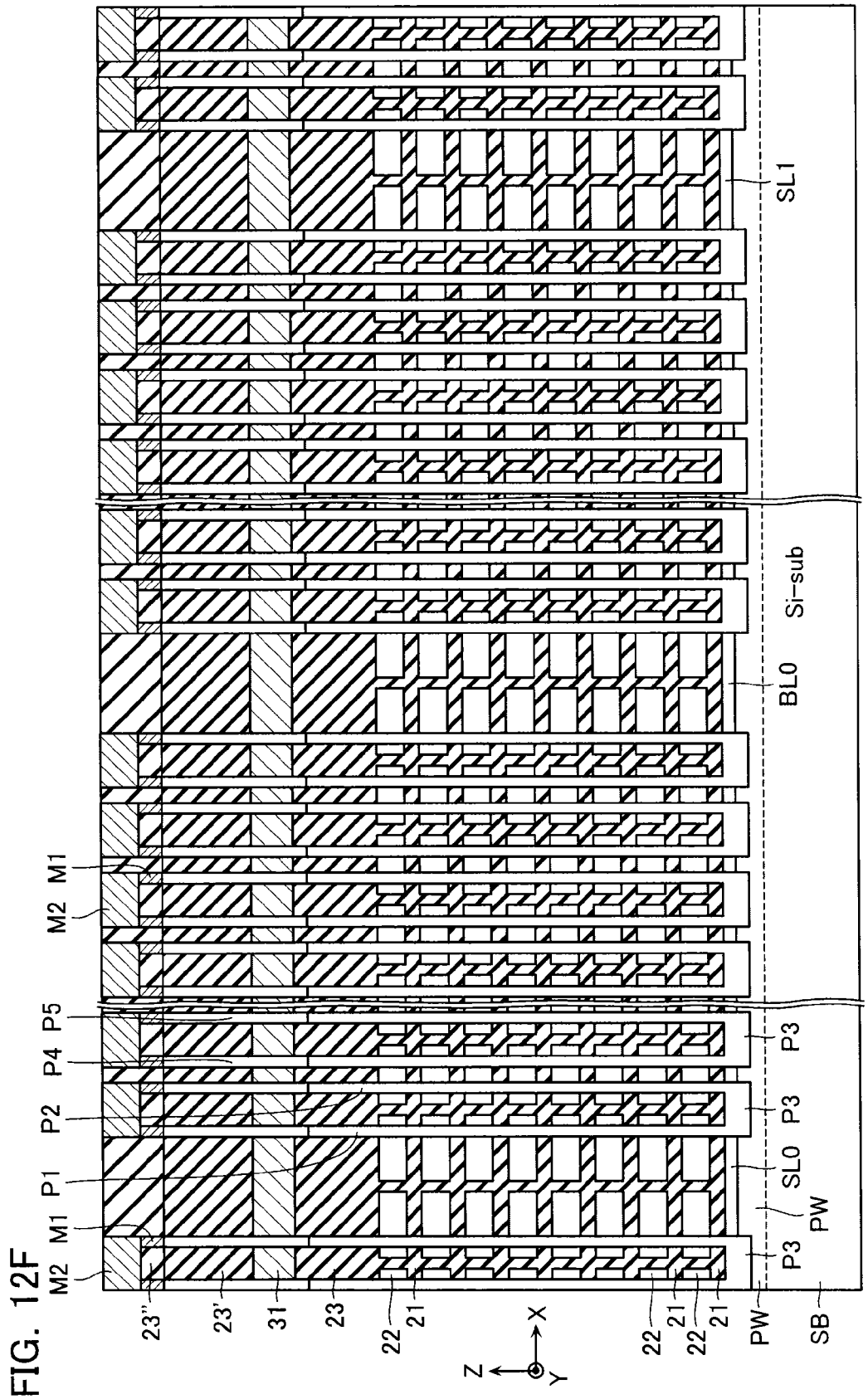
FIG. 12F is a process diagram showing the method of manufacturing the nonvolatile semiconductor memory device 100 according to the first embodiment.

Next, after an interlayer insulating film 23" configured from a silicon oxide film has been further stacked on the interlayer insulating film 23' as shown in FIG. 12E, then a contact plug Ml reaching an edge of the pillar portions P4 and P5 is formed in this interlayer insulating film 23" as shown in FIG. 12F. Then, a damascene method is employed to form a metal wiring line M2 of copper, aluminum, or the like. This metal wiring line M2 becomes the previously mentioned sub-bit line LBL. As a result of the above processes, the nonvolatile semiconductor memory device according to the first embodiment is completed.

Note that, instead of the process in FIG. 12F, it is also possible to employ a dual damascene method to form a metal wiring line M3 of the kind shown in FIG. 12G and have this metal wiring line M3 function as the sub-bit line LBL.

Figure 12H:
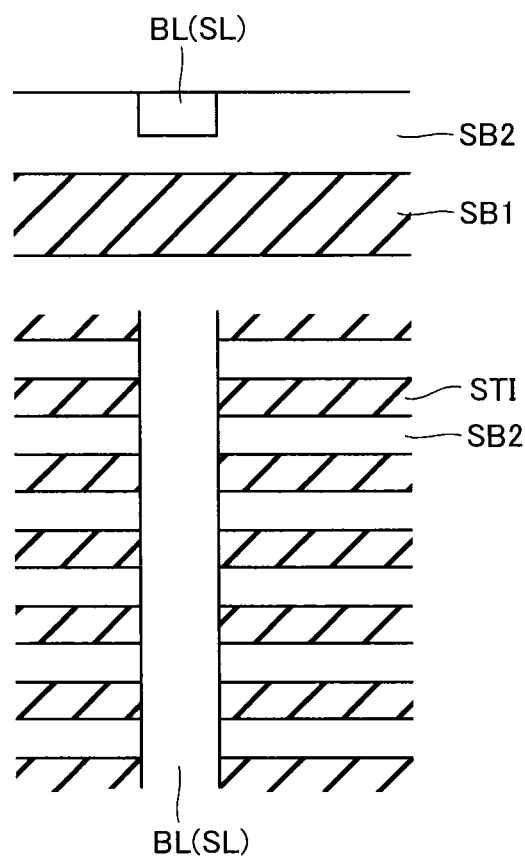
FIG. 12H is a modified example of the nonvolatile semiconductor memory device 100 according to the first embodiment.

In addition, as shown in FIG. 12H, although in the above-described embodiment, the bit line BL and the source line SL are formed by a nickel silicide film (NiSi), the bit line BL and the source line SL may be formed by forming a trench in a silicon substrate SB2 formed on a silicon oxide film substrate SB1, and burying a metal film in the trench using a damascene method or the like.

Figure 13:
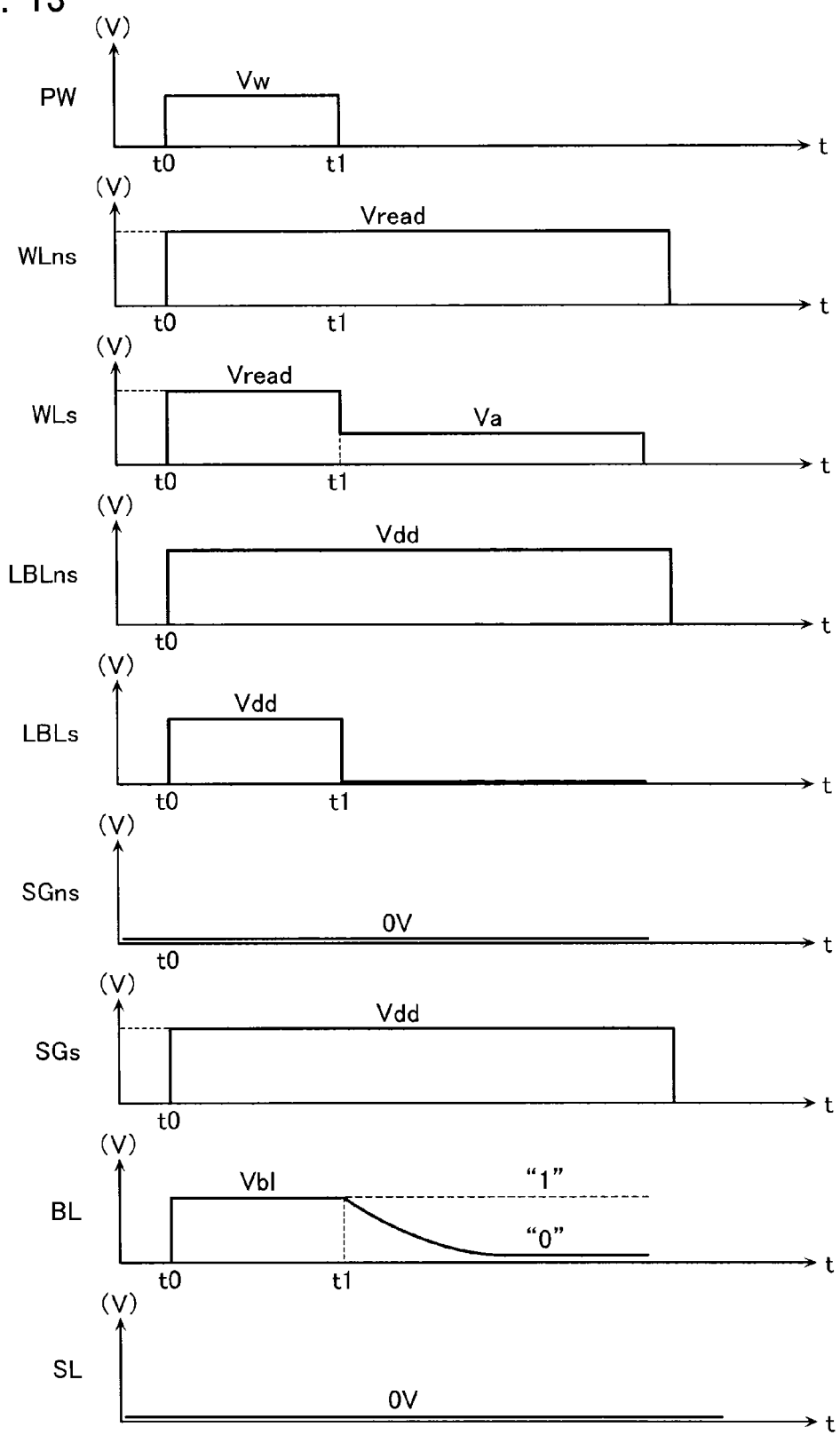
FIG. 13 is a timing chart showing a procedure of a read operation in the nonvolatile semiconductor memory device 100 according to the first embodiment.

Next, a read operation in this nonvolatile semiconductor memory device is described with reference to the timing chart of FIG. 13. In this example, description proceeds assuming the case of selecting one memory string MS of the eight memory strings MS along a selected one of the select gate lines SGs as a selected memory string MSs, and of selecting one memory transistor MT in that selected memory string MSs as a selected memory transistor MTs to perform the read operation. Note that the memory transistor MT is assumed to store either of data "1" indicating an erase state or data "0" indicating a write state (1 bit of data).

First, at time t0, a voltage Vw is provided to the p type well PW by the well driver 17. Meanwhile, a power supply voltage Vdd is provided in all of the sub-bit lines LBL from the column decoder 16, and the selected gate line SGs connected to the memory string MS including the selected memory cell is similarly provided with the power supply voltage Vdd from the row decoder 13. The remaining select gate lines SGns are maintained at a ground voltage Vss. Meanwhile, all of the word lines WL are applied with a voltage (read pass voltage Vread) capable of rendering the memory transistor MT conductive regardless of which of data "0" or "1" is retained in the memory cell. As a result of the above voltage application operation, the body P of the memory string MS along the select gate line SGs is charged to a certain voltage (Vdd−Vt, where Vt is a threshold voltage of the select transistor S1 or S2). On the other hand, at time t0, a voltage of the bit line BL is set to a pre-charge voltage Vbl.

At following time t1, the voltage of the p type well PW is set to 0 V (ground voltage Vss), and the voltage of the sub-bit line LBL (selected sub-bit line LBLs) connected to the memory string MS (selected memory string MSs) including the selected memory cell is returned from the power supply voltage Vdd to 0 V. This results in a pre-charging operation of the body P of the selected memory string MSs being completed. Meanwhile, the voltage supplied to the sub-bit lines other than the selected sub-bit line LBLs (non-selected sub-bit lines LBLns) is maintained at the power supply voltage Vdd. That is, the body P of the seven non-selected memory strings MSns formed along the select gate line SGs are left in a state where the pre-charging operation is continued.

Moreover, the voltage of the word line WL connected to the selected memory cell MT (selected word line WLs) is switched from the read pass voltage Vread to a read voltage Va. The read voltage Va is a voltage between an upper limit and a lower limit of two threshold voltage distributions expressing one bit of data. A selected memory cell made conductive by this read voltage Va is judged to be retaining data "1", and, conversely, a selected memory cell not made conductive by this read voltage is judged to be retaining data "0".

When a selected memory cell retaining data "1" is made conductive by application of the above-described read voltage Va, a potential of the body P of the selected memory string MSs drops towards 0 V due to discharge. On the other hand, when the selected memory cell retains data "0", the selected memory cell does not attain a conductive state due to application of the above-described read voltage Va. In this case, the potential of the body P of the selected memory string MSs is maintained at Vdd−Vt.

In this way, the voltage of the body P of the non-selected memory strings MSns along the select gate line SGs is maintained at the voltage after pre-charging (Vdd−Vt). Therefore, the transistors T connected to these non-selected memory strings MSns are maintained in a conductive state.

On the other hand, the voltage of the body of the selected memory string MSs is maintained at Vdd−Vt if retained data of the selected memory cell is "0", but is discharged toward 0 V if retained data of the selected memory cell is "1". In the former case, the selected transistor Ts connected to the selected memory string MSs maintains a conductive state, but in the latter case, switches from a conductive state to a non-conductive state. In the case of a conductive state, the bit line BL discharges toward 0 V, and in the case of a non-conductive state, the voltage of the bit line BL is maintained at the voltage Vbl. Detection of this by the sense amplifier 15 enables retained data of the selected memory cell to be read.

In this way, the present embodiment allows read of retained data of a selected memory cell in a memory string MS to be judged not by current flowing in the memory string MS, but by whether current flows in a transistor string TS located below the memory string MS or not (by change in potential of the bit line BL connected to the transistor string TS). The transistors T in the transistor string TS have a size which is large compared to the memory transistors MT, hence can allow a larger read current to flow. Therefore, the present embodiment allows an accurate and fast read operation to be executed even when miniaturization of the memory transistor MT advances and the number of stacked layers of memory increases. Note that the write operation and erase operation may be executed by a procedure similar to that in a conventional stacked type NAND flash memory.

[Second Embodiment]

Next, a nonvolatile semiconductor memory device according to a second embodiment is described with reference to FIGS. 14~16. In the nonvolatile semiconductor memory device of the second embodiment, a configuration of the linking portion P3 which is part of the body P of the memory string MS differs from that of the first embodiment. Other configurations are substantially identical to those in the first embodiment (as in FIGS. 1~4), hence a detailed description of such other configurations is omitted.

Figure 14:
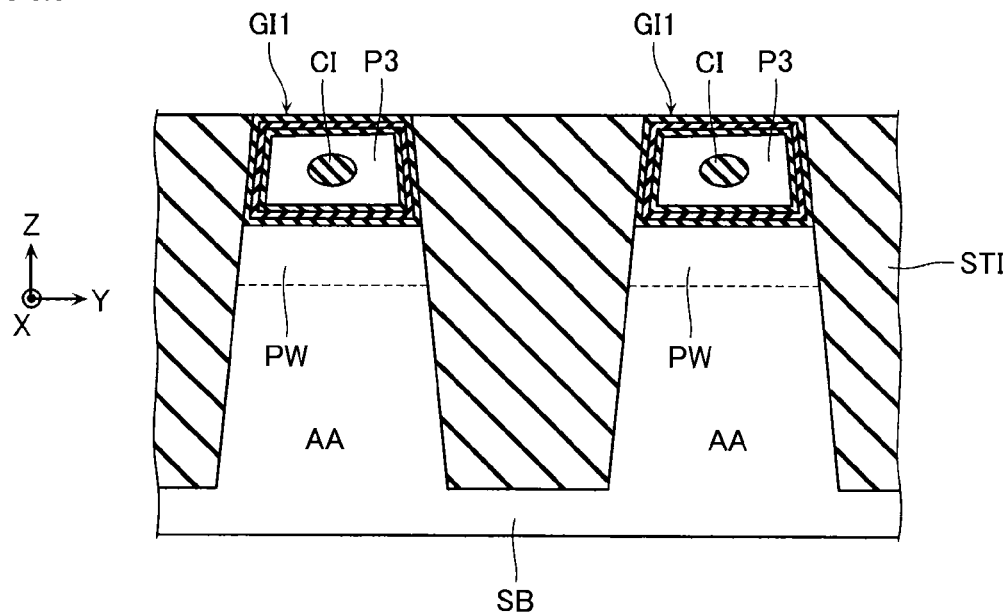
FIG. 14 is a cross-sectional view showing a structure of a linking portion P3 in the first embodiment.

A structure of the linking portion P3 in the first embodiment is shown in FIG. 14 for comparison. FIG. 14 is a cross-sectional view in the Y direction of the linking portion P3 in the first embodiment. In the first embodiment, the semiconductor substrate SB is separated by the element isolation insulating film STI, whereby the linking portion P3 is formed in a separated stripe-shaped active area AA. The element isolation insulating film STI is formed, by RIE or the like, in a reverse-tapered shape having a small bottom width. Conversely, the strip-shaped active area AA is formed in a tapered shape having a small top width compared to that of the bottom. The linking portion P3 is formed at a top portion of this tapered active area AA, hence ends up having an extremely narrow-width structure. In addition, since the gate insulating film GI1 is formed in a periphery of the linking portion P3, the width of the linking portion P3 ends up being even narrower than a width of the top portion of the striped active area AA. Such a narrow-width linking portion P3 limits an amount of current flowing in the memory string MS, leading to a lowering of operation performance.

Figure 15:
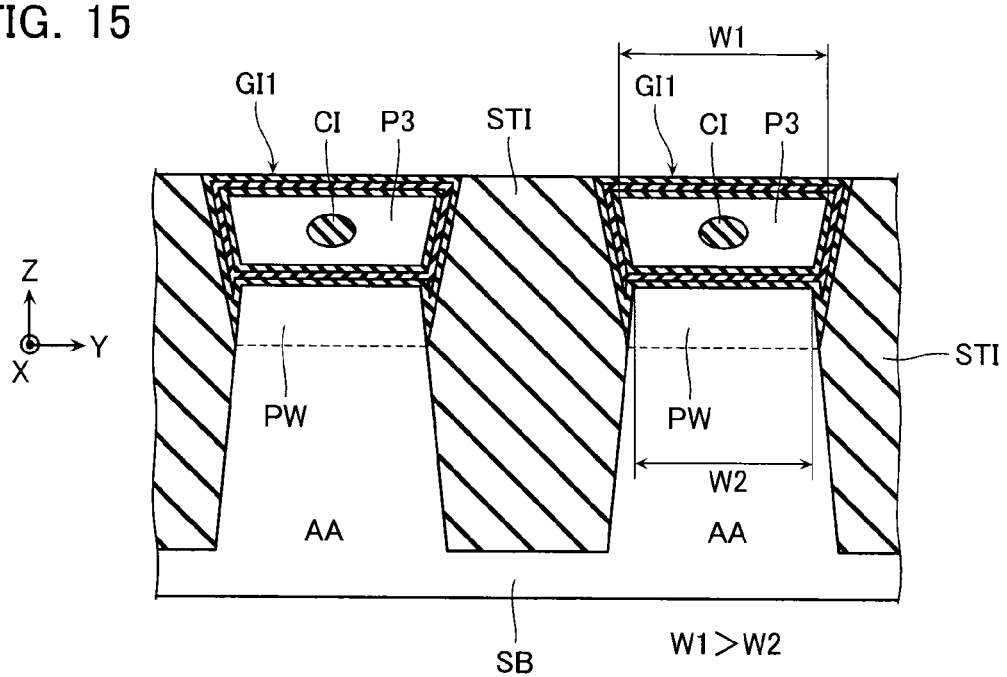
FIG. 15 is a cross-sectional view showing a structure of a linking portion P3 in a second embodiment.

FIG. 15 shows the configuration of the linking portion P3 in the nonvolatile semiconductor memory device according to the second embodiment. The element isolation insulating film STI in this second embodiment does not have a reverse tapered shape, but has a shape with a narrowed top portion. As a result, the linking portion P3, contrary to the isolation insulating film STI, has a reverse tapered shape in which a width of a top portion is broader than that of a bottom portion, whereby a width W1 of the linking portion P3 is configured larger than a width W2 of the top portion of the active area AA.

Figure 16:
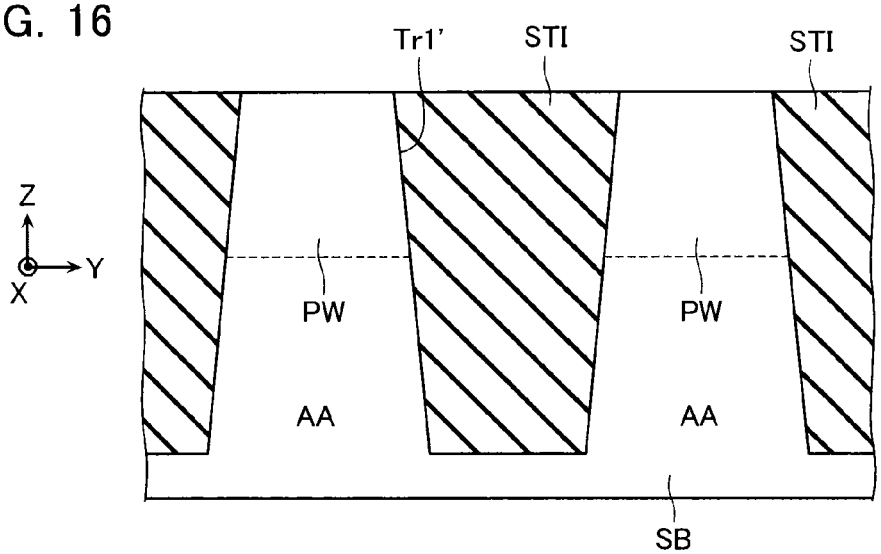
FIG. 16 is a process diagram showing a method of forming the linking portion P3 in the second embodiment.
Figure 17:
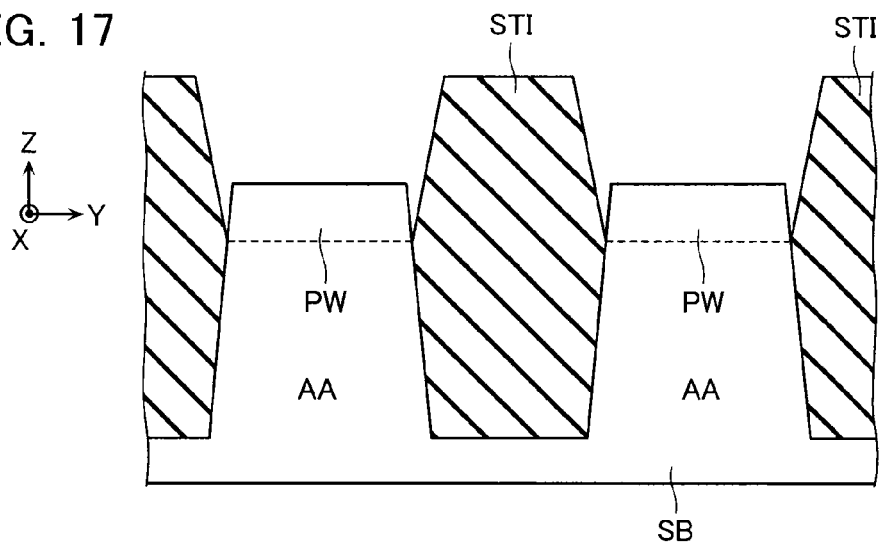
FIG. 17 is a process diagram showing the method of forming the linking portion P3 in the second embodiment.

Such an element isolation insulating film STI having a shape with a narrowed top portion may be formed by processes shown in FIGS. 16~17. That is, as shown in FIG. 16, after a trench Tr1' has been formed at equal intervals on the semiconductor substrate SB, this trench Tr1' is embedded with the element isolation insulating film STI. Then, wet etching is performed on the entirety of the semiconductor substrate SB. As a result, as shown in FIG. 17, a position of the top portion of the active area AA recedes downwards, and, at the same time, the element isolation insulating film STI also changes from a reverse tapered shape to a shape with a narrowed top portion. Executing similar processes to those in the first embodiment thereafter enables the cross-sectional shape of FIG. 15 to be obtained.

Processes of the above kind allow the width W1 of the linking portion P3 formed at the top portion of the active area AA to be made larger than the width W2 of the top portion of the active area AA. This allows the amount of current flowing in the memory string MS to be increased and operation performance to be improved.

[Third Embodiment]

Next, a nonvolatile semiconductor memory device according to a third embodiment is described with reference to FIGS. 18~23. In the nonvolatile semiconductor memory device of the third embodiment, a configuration of the linking portion P3 which is part of the body P of the memory string MS differs from that of the first embodiment. Other configurations are substantially identical to those in the first embodiment (as in FIGS. 1~4), hence a detailed description of such other configurations is omitted.

Figure 18:
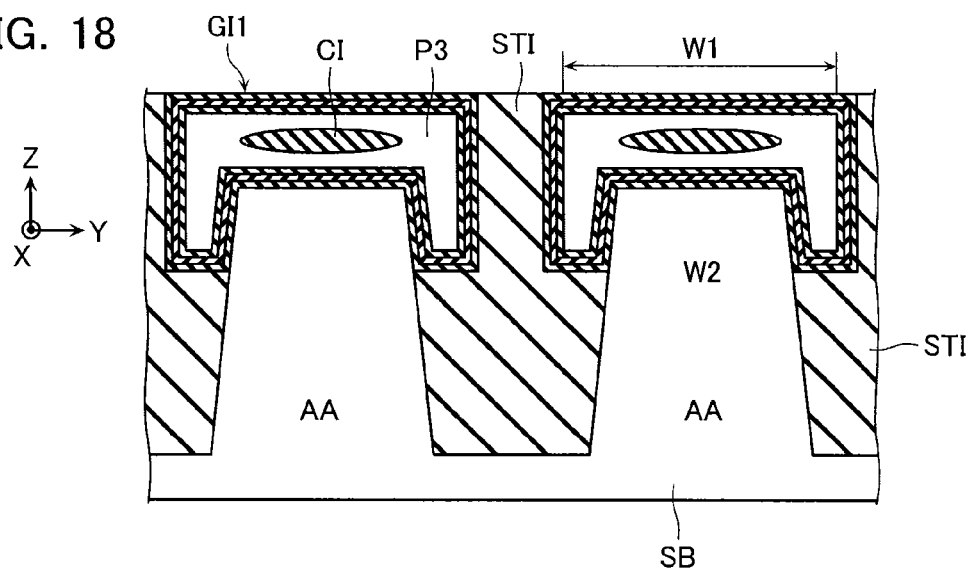
FIG. 18 is a cross-sectional view showing a structure of a linking portion P3 in a third embodiment.

FIG. 18 shows the configuration of the linking portion P3 in the nonvolatile semiconductor memory device according to the third embodiment. The linking portion P3 in this third embodiment resembles that of the second embodiment in having a width W1 which is larger than the width W2 of the top portion of the active area AA, similarly to in the second embodiment. However, the linking portion P3 in the third embodiment has a flat-topped reverse U shape such that side surfaces of the linking portion P3 cover the top portion of the tapered active area AA.

A method of forming the linking portion P3 in the third embodiment is described with reference to FIGS. 19~23.

Figure 19:
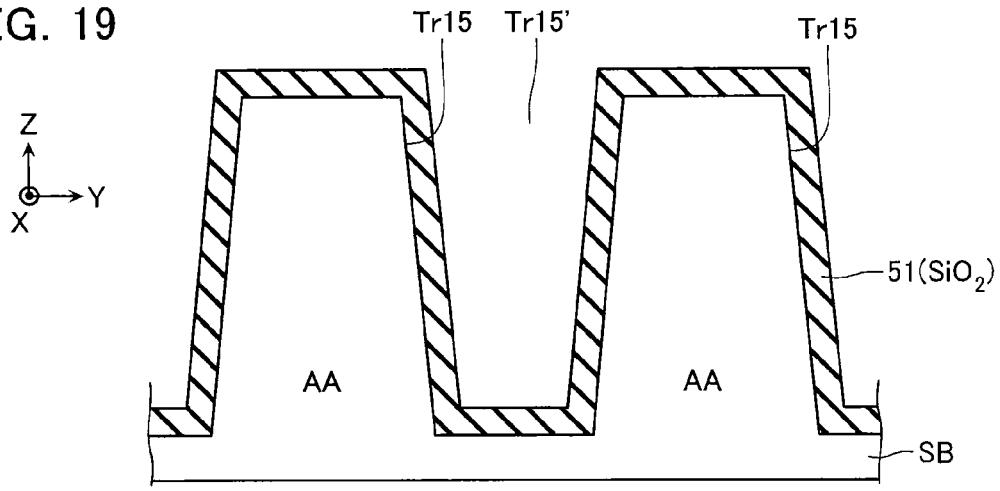
FIG. 19 is a process diagram showing a method of forming the linking portion P3 in the third embodiment.

First, as shown in FIG. 19, a trench Tr15 of a certain width is formed at equal intervals in the semiconductor substrate SB, and then a silicon oxide film 51, for example, is deposited on an entire surface of the semiconductor substrate SB. A film thickness of the silicon oxide film 51 is set to a value sufficient to prevent the trench Tr15 from being filled by this silicon oxide film 51. That is, a trench Tr15' is left inside the trench Tr15.

Figure 20:
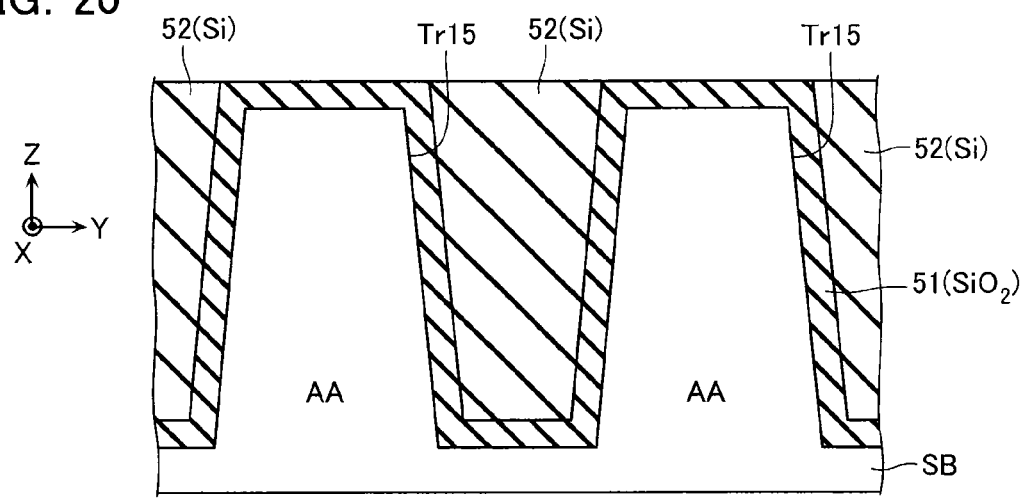
FIG. 20 is a process diagram showing the method of forming the linking portion P3 in the third embodiment.

Then, as shown in FIG. 20, a silicon film 52 (Si) is deposited to fill this trench Tr15'.

Figure 21:
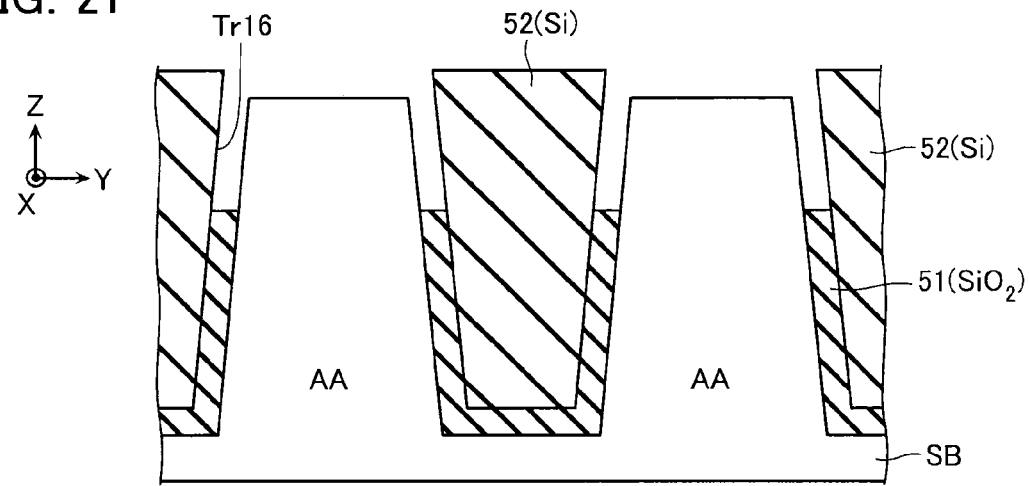
FIG. 21 is a process diagram showing the method of forming the linking portion P3 in the third embodiment.
Figure 22:
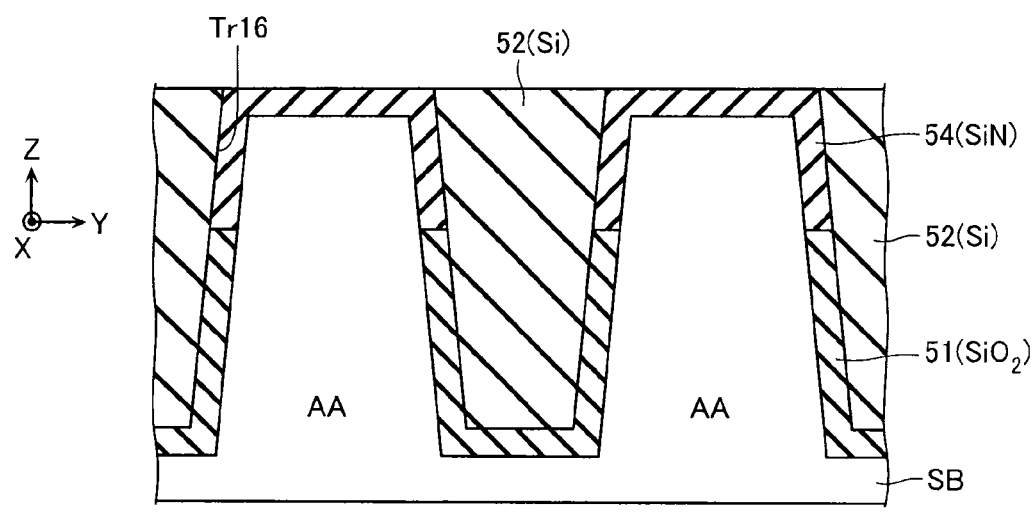
FIG. 22 is a process diagram showing the method of forming the linking portion P3 in the third embodiment.
Figure 23:
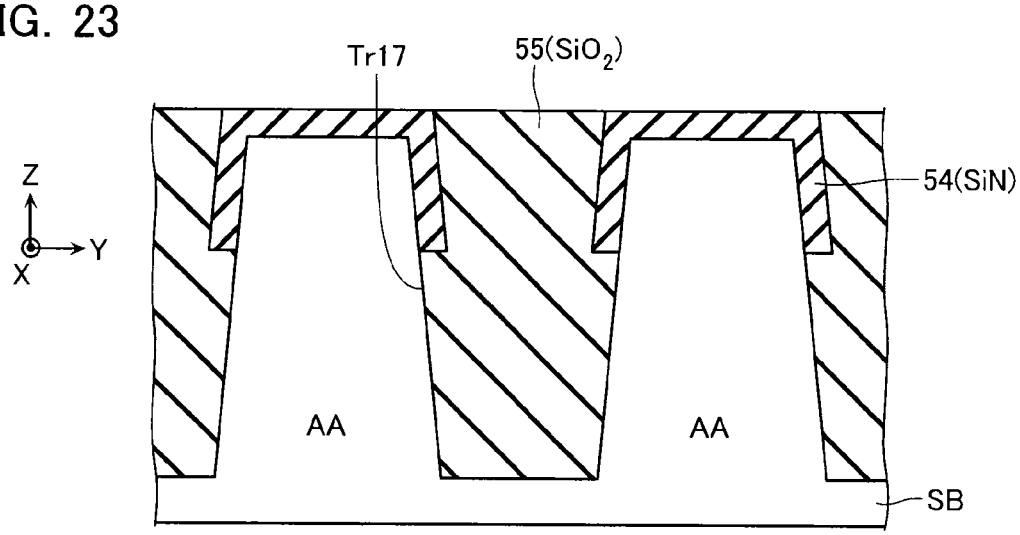
FIG. 23 is a process diagram showing the method of forming the linking portion P3 in the third embodiment.

Then, as shown in FIG. 21, wet etching using for example dilute hydrofluoric acid as an etching solution is executed, causing the top portion only of the silicon oxide film 51 to be removed. Then, as shown in FIG. 22, a silicon nitride film 54 (SiN) is deposited, by executing a CVD method or the like, to fill a trench Tr16 formed by this silicon oxide film 51 being removed.

Then, wet etching using TMY (trimethyl 2-hydroxyethyl ammonium hydroxide, $[(CH_3)_3N(CH_2CH_2OH)]^+OH^-$) as an etching solution is executed to remove the silicon film 52, and wet etching using dilute hydrofluoric acid as an etching solution is further executed to remove the silicon oxide film 51. A trench Tr17 thus formed is embedded with a silicon oxide film 55 ($SiO2$) (refer to FIG. 23). Then, executing similar processes to those in the first embodiment enables the structure in FIG. 18 to be obtained. That is, the linking portion P3 can be formed at a position of the silicon nitride film 54 acting as a sacrifice film.

[Fourth Embodiment]

Figure 24A:
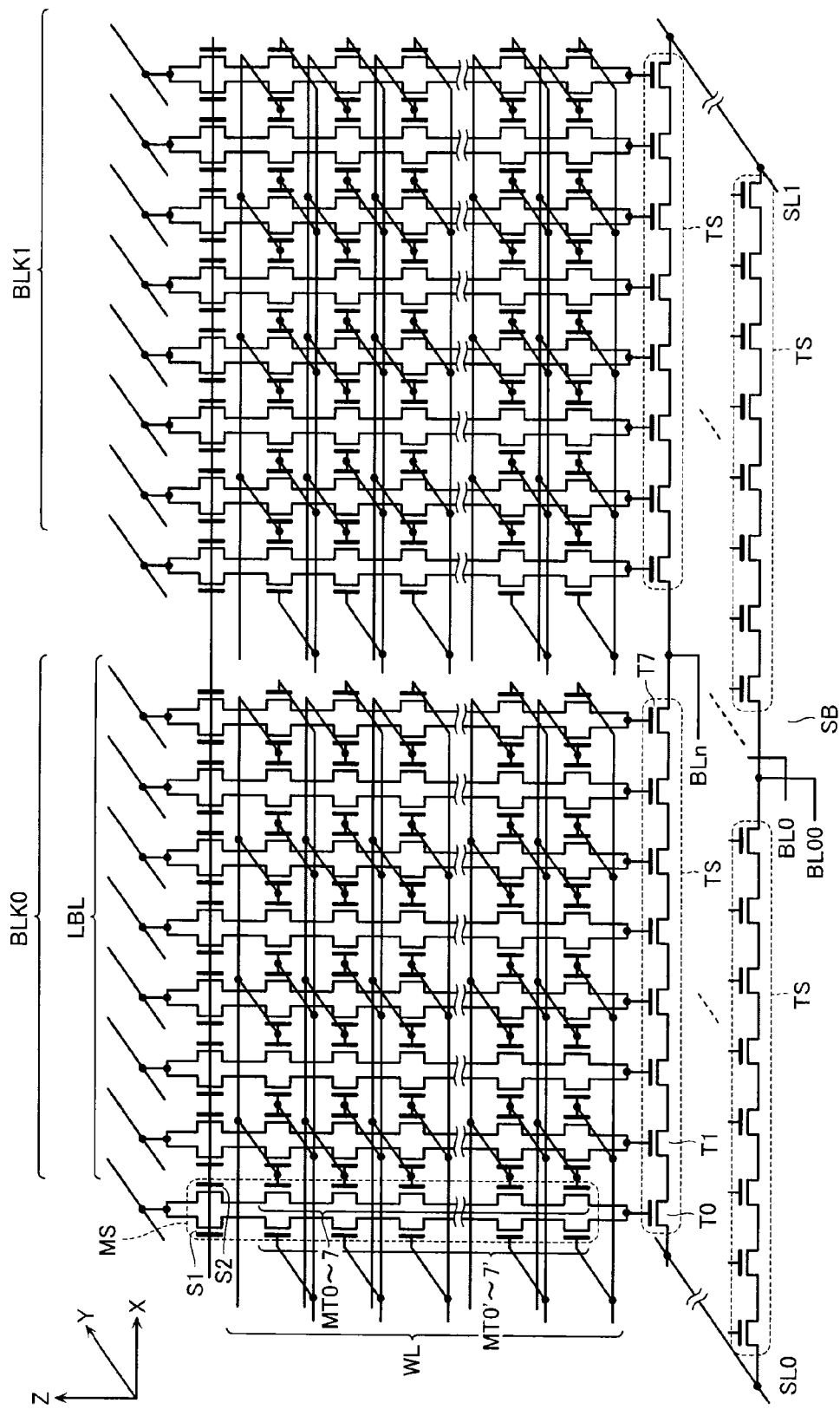
FIG. 24A is an equivalent circuit diagram of a memory cell array 11 in a fourth embodiment.

Next, a nonvolatile semiconductor memory device according to a fourth embodiment is described with reference to FIG. 24A. In the nonvolatile semiconductor memory device of the fourth embodiment, a structure of the memory cell array 11 differs from that in the first embodiment. Other configurations are substantially identical to those in the first embodiment, hence a detailed description of such other configurations is omitted.

The memory cell array 11 in this fourth embodiment has a plurality of bit lines BL00, BL01, BL0n−1 provided independently to each of the plurality of transistor strings TS0~TSn−1 in one block. This differs from the first embodiment in which the plurality of transistor strings TS0~TSn−1 in one block BLK0 are commonly connected to a single bit line BL. This fourth embodiment enables a plurality of memory strings MS in one block to simultaneously undergo the write operation, thereby allowing a speeding up of the write operation to be achieved.

Figure 24B:
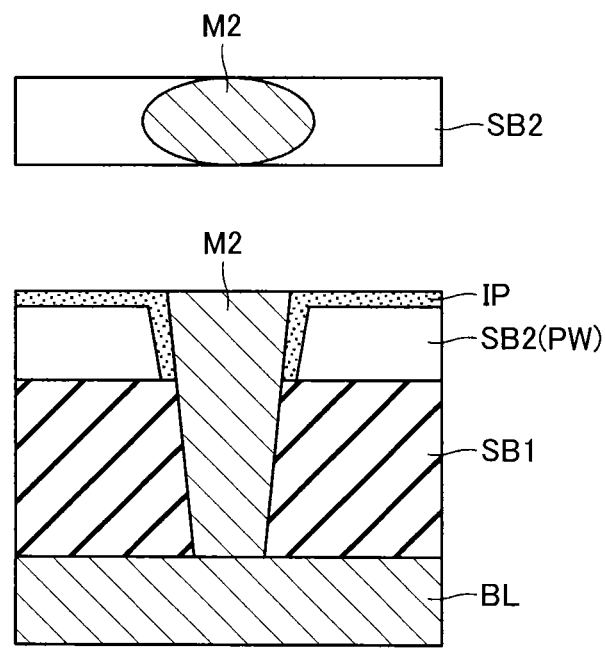
FIG. 24B is a plane view and a cross-sectional view of the memory cell array 11 according to the fourth embodiment.

With reference to FIG. 24B, a configuration example of the bit line BL in the nonvolatile semiconductor memory device according to the fourth embodiment will be explained. In this example, a contact plug M2 is formed for each of the transistor strings TS0 to TSn−1. Moreover, the bit line BL is formed under a silicon oxide film SB1 formed under a semiconductor substrate SB2 where the p-type well PW is formed. The lower end of the above-described contact plug Ml is electrically connected to this bit line BL. Note that a high-concentration p+type layer IP is formed on a side wall of the trench where the contact plug M2 is buried, in order to ohmic-contact the p type well PW to the contact plug M2.

[Fifth Embodiment]

Figure 25:
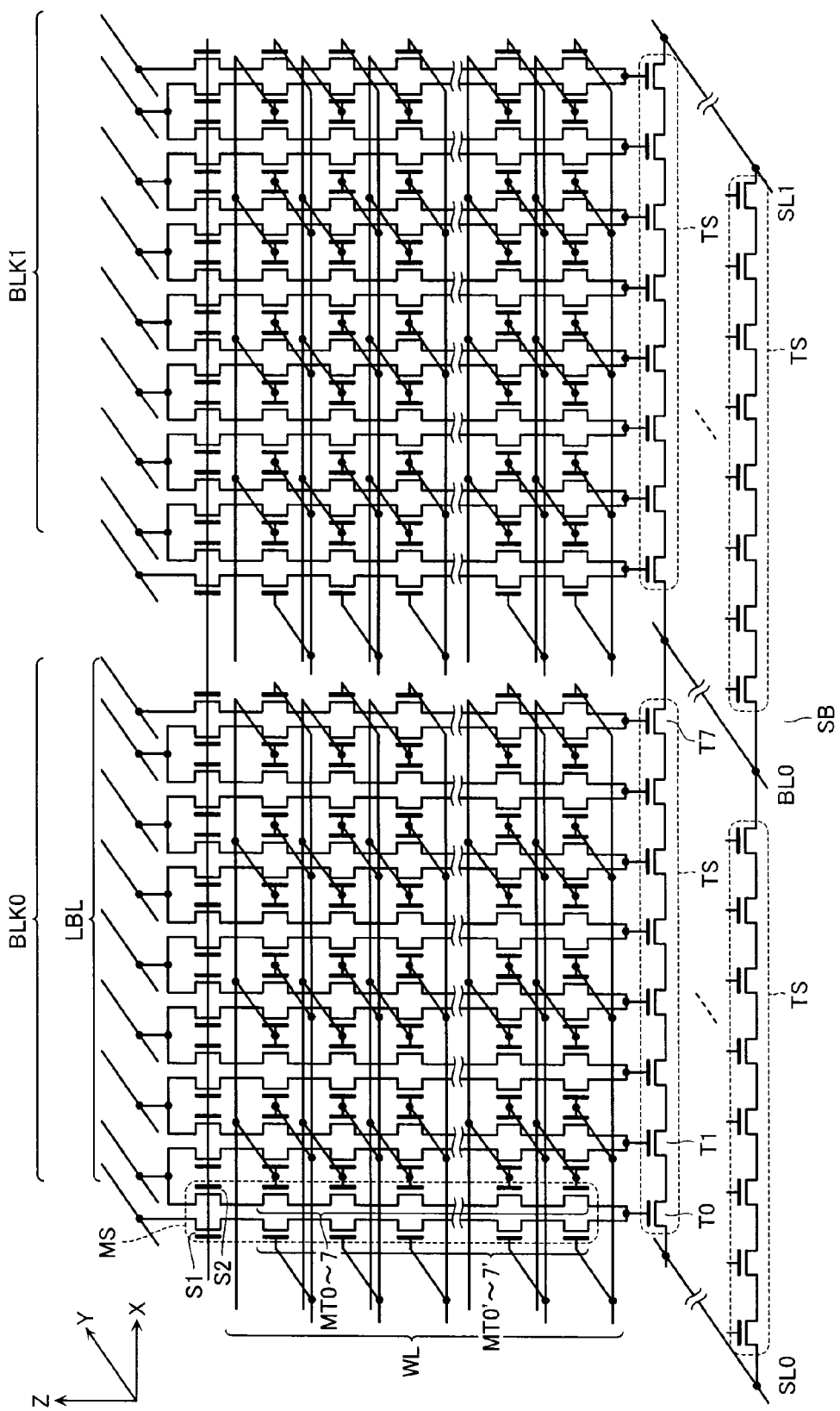
FIG. 25 is an equivalent circuit diagram of a memory cell array 11 in a fifth embodiment.

Next, a nonvolatile semiconductor memory device according to a fifth embodiment is described with reference to FIG. 25. In the nonvolatile semiconductor memory device of the fifth embodiment, a structure of the memory cell array 11 differs from that in the first embodiment. Other configurations are substantially identical to those in the first embodiment, hence a detailed description of such other configurations is omitted.

The memory cell array 11 in this fifth embodiment differs from that in the first embodiment in having one sub-bit line LBL commonly connected to two memory strings MS aligned in the X direction. In other words, the select transistors S1 and S2 in one memory string MS are each connected to a separate sub-bit line LBL. The read operation and so on can be executed similarly to in the first embodiment.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the memory string MS in the above-described embodiments includes a U-shaped body P, but a memory string having a linear body P along which memory cells are arranged in a line may also be adopted instead of the memory string MS having the U-shaped body P.

Moreover, as well as the pillar portion P forming the memory string MS in the above-described embodiments, it is possible also to form a dummy pillar portion where merely dummy memory cells are formed.

Figure 26A:
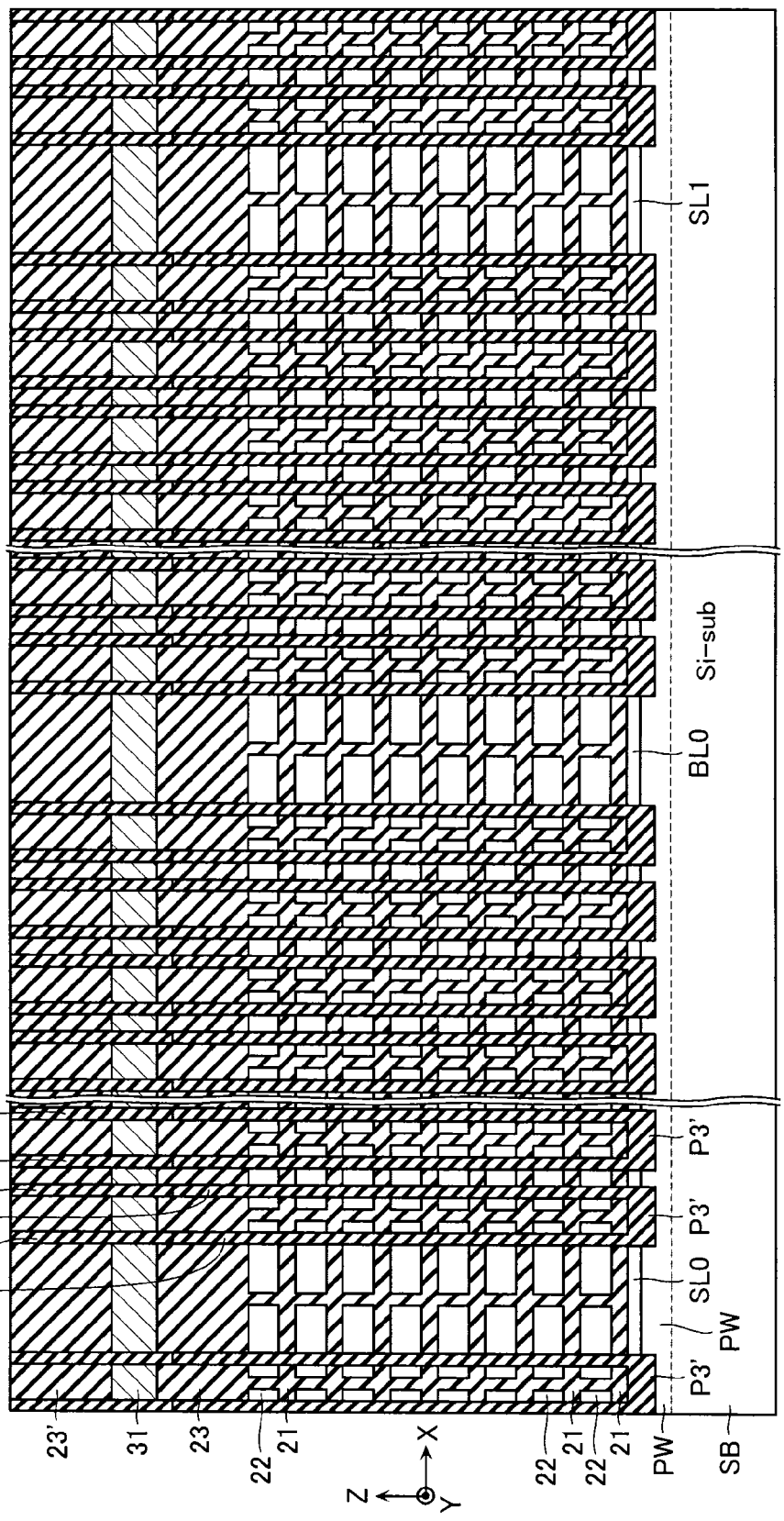
FIG. 26A is a process diagram showing a separate method of manufacturing a nonvolatile semiconductor memory device according to an embodiment.

In addition, the manufacturing processes are also not limited to the processes shown in FIGS. 5~12G. For example, in the above-described embodiments, a process for removing all the sacrifice films P1', P2', and P3' after formation of the trench Tr3 of FIG. 12A was executed, but instead of this, processes shown in FIGS. 26A~26C may also be executed, for example.

After completion of the process of FIG. 12A, the sacrifice films P1', P2', and P3' are not removed, but instead the trench Tr3 is further filled with sacrifice films P4' and P5'. Then, as shown in FIG. 26B, a silicon nitride film 24 is deposited on the interlayer insulating film 23'.

Figure 26C:
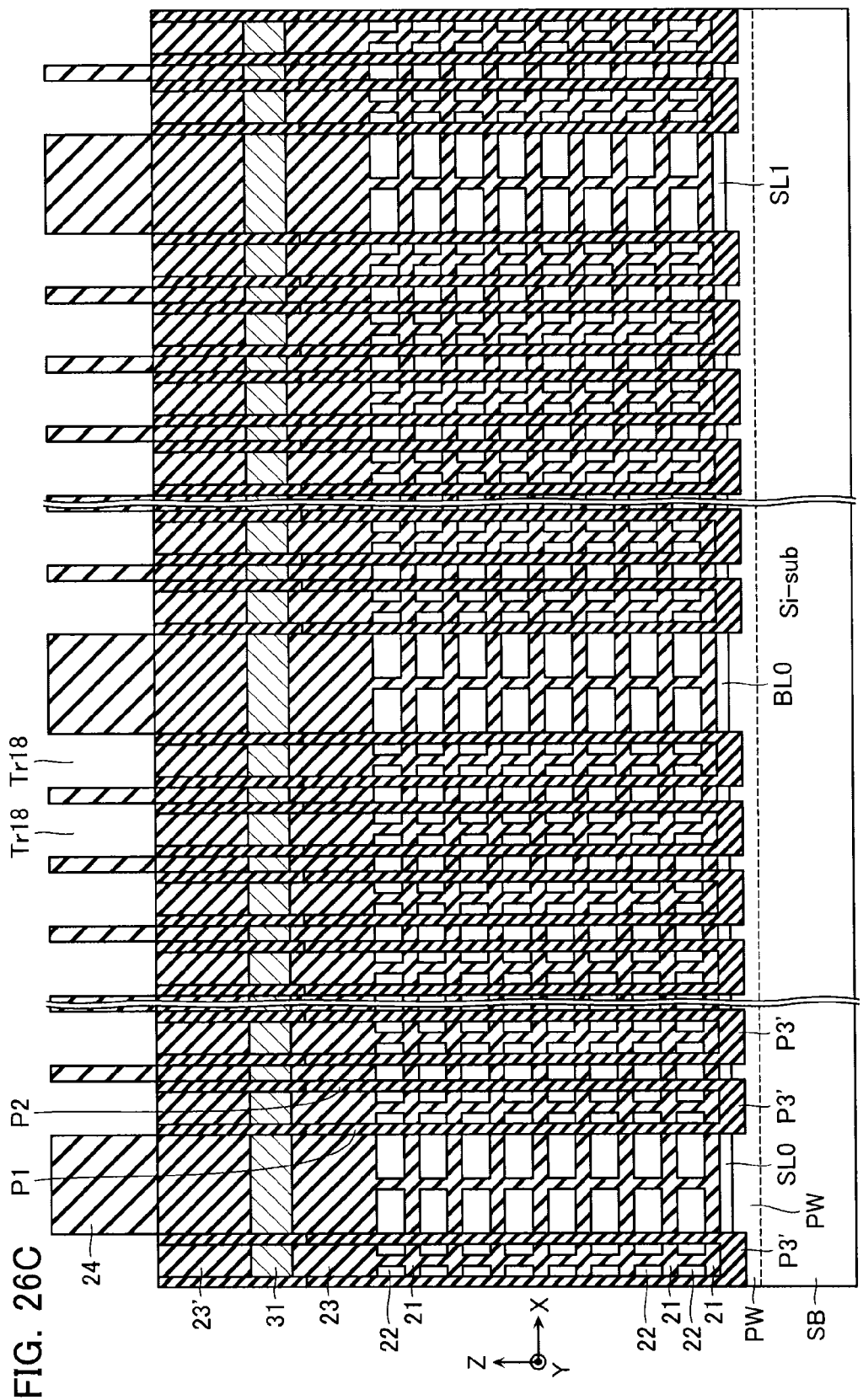
FIG. 26C is a process diagram showing the separate method of manufacturing a nonvolatile semiconductor memory device according to an embodiment.

Then, as shown in FIG. 26C, anisotropic etching is executed on the silicon nitride film 24 to form a trench Tr18 having a width in the X direction which is substantially identical to a width in the X direction of the memory string MS.

Figure 26D:
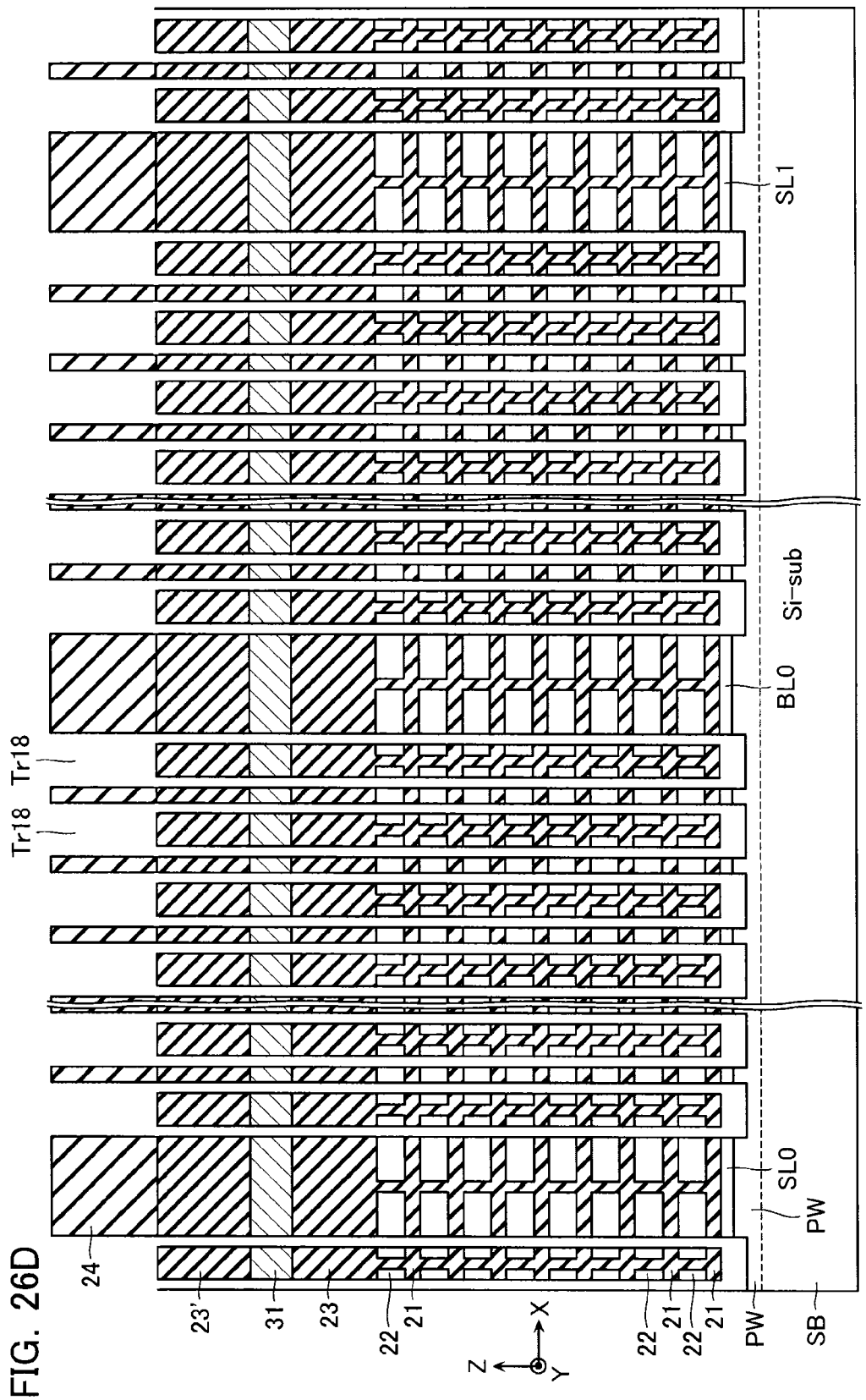
FIG. 26D is a process diagram showing the separate method of manufacturing a nonvolatile semiconductor memory device according to an embodiment.
Figure 26E:
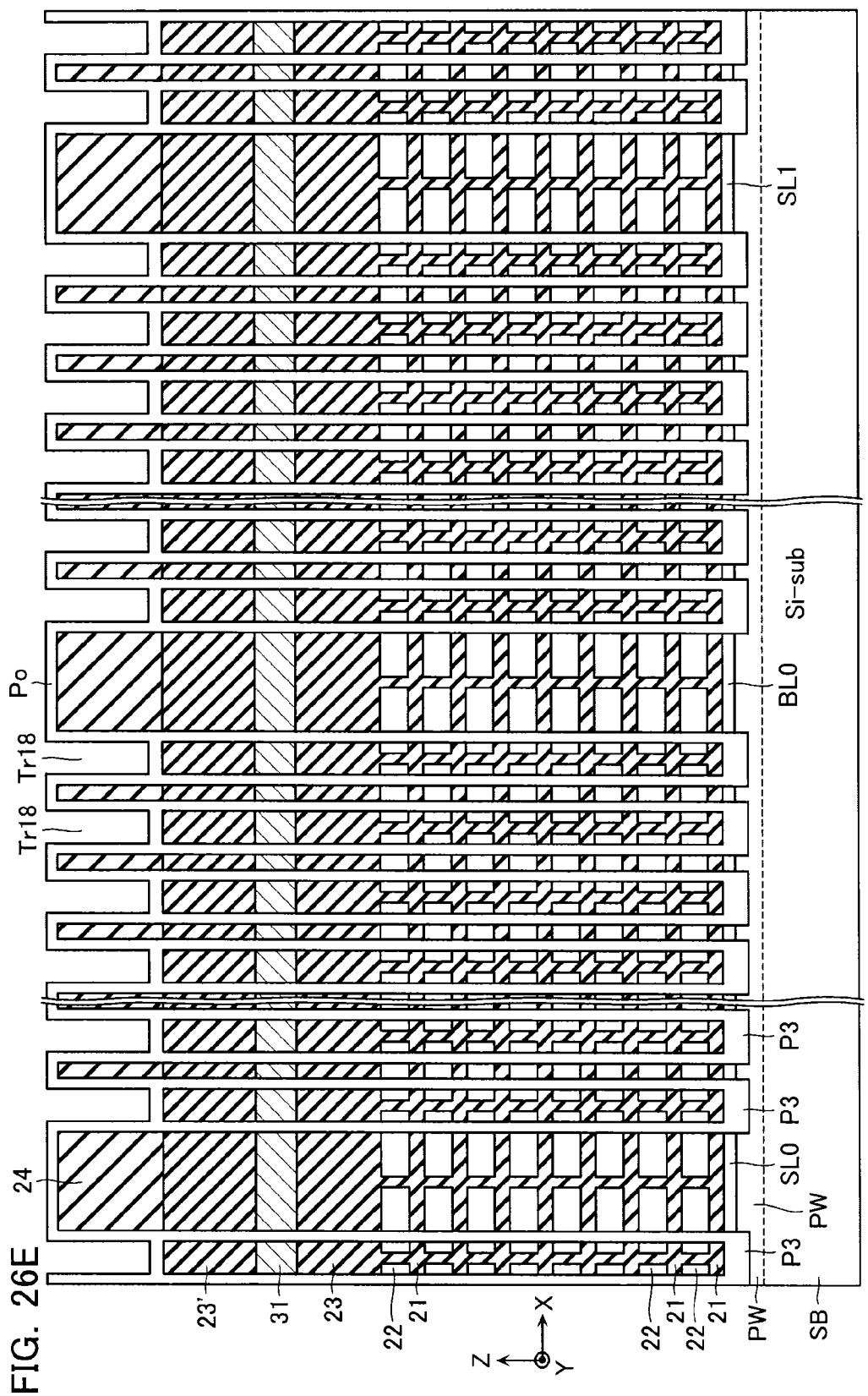
FIG. 26E is a process diagram showing the separate method of manufacturing a nonvolatile semiconductor memory device according to an embodiment.

Then, as shown in FIG. 26D, anisotropic etching is executed to remove the sacrifice films P1'~P5'. Following this, as shown in FIG. 26E, after forming the gate insulating films GI1 and GI2 on a side wall of the trenches Tr0, Tr1, and Tr3 (the gate insulating films GI1 and GI2 are not illustrated in FIG. 26E), a polysilicon film Po for forming the body P is embedded inside the trenches Tr0, Tr1, and Tr3. At this time, the polysilicon film Po is formed not only inside the trenches Tr0, Tr1, and Tr3, but also inside the trench Tr18 and on a surface of the silicon nitride film 24. Then, after removing the polysilicon film Po on the surface of the silicon nitride film 24 by CMP, a metal wiring line M4 is formed inside the trench 18 by sputtering. This metal wiring line M4 and the polysilicon film Po function as the sub-bit line LBL.

What is claimed is:

1. A nonvolatile semiconductor memory device, comprising:
    a transistor string formed on a substrate and including a plurality of first transistors connected in series with each other;
    a first bit line connected to a first end of the transistor string;
    a source line connected to a second end of the transistor string;
    a memory string that extends in a direction perpendicular to the substrate and comprises a plurality of nonvolatile memory transistors and a select transistor connected in series, a first end of the memory string being connected to a gate of the first transistor;
    a word line connected to a control gate of the memory transistors;
    a select gate line connected to a control gate of the select transistor;
    a second bit line connected to a second end of the memory string via the select transistor; and
    a control unit configured to control the first bit line, the source line, the word line, the select gate line, and the second bit line.

2. The nonvolatile semiconductor memory device according to claim 1, wherein
    the word line is commonly connected to the memory transistors in one block.

3. The nonvolatile semiconductor memory device according to claim 1, further comprising:
    a sense amplifier connected to the first bit line and configured to detect and amplify a voltage of the first bit line.

4. The nonvolatile semiconductor memory device according to claim 1, wherein
    a plurality of the transistor strings are formed having a first direction as a long direction and are arranged aligned in a second direction orthogonal to the first direction.

5. The nonvolatile semiconductor memory device according to claim 4, wherein
    the memory strings are arranged in a matrix in a plane defined by the first direction and the second direction.

6. The nonvolatile semiconductor memory device according to claim 5, wherein
    the word line is commonly connected to a plurality of the memory strings arranged in a matrix.

7. The nonvolatile semiconductor memory device according to claim 4, wherein
    the select gate line is formed having the first direction as a long direction and is commonly connected to a plurality of the memory strings arranged along the first direction.

8. The nonvolatile semiconductor memory device according to claim 4, wherein
    the second bit line is formed having the second direction as a long direction and is commonly connected to a plurality of the memory strings arranged along the second direction.

9. The nonvolatile semiconductor memory device according to claim 4, wherein
    the select gate line is formed having the first direction as a long direction and is commonly connected to a plurality of the memory strings arranged along the first direction, and
    the second bit line is formed having the second direction as a long direction and is commonly connected to a plurality of the memory strings arranged along the second direction.

10. The nonvolatile semiconductor memory device according to claim 1, wherein
    the first transistor is a p type MOSFET.

11. The nonvolatile semiconductor memory device according to claim 1, wherein
    one of the plurality of nonvolatile memory transistors is directly connected to the gate of the first transistor.

12. The nonvolatile semiconductor memory device according to claim 1, wherein
    the memory string is connected to the gate of the first transistor without any select transistor therebetween.

13. The nonvolatile semiconductor memory device according to claim 1, wherein
    a nearest transistor in the memory string to the first transistor is one of the plurality of nonvolatile memory transistors.

14. The nonvolatile semiconductor memory device according to claim 1, wherein
    one of the plurality of nonvolatile memory transistors is provided at the third end of the memory string, and the select transistor is provided at the fourth end of the memory string.

15. A nonvolatile semiconductor memory device, comprising:

a transistor string including a plurality of first transistors that are connected in series with each other;
a first bit line connected to a first end of the transistor string;
a source line connected to a second end of the transistor string;
a memory string comprising a plurality of nonvolatile memory transistors and a select transistor and connected in series, a first end of the memory string being connected to a gate of the first transistor;
a word line connected to a control gate of the memory transistor;
a select gate line connected to a control gate of the select transistor;
a second bit line connected to a second end of the memory string via the select transistor; and
a control unit configured to control the first bit line, the source line, the word line, the select gate line, and the second bit line.

16. The nonvolatile semiconductor memory device according to claim 15, further comprising:
a sense amplifier connected to the first bit line and configured to detect and amplify a voltage of the first bit line.

17. The nonvolatile semiconductor memory device according to claim 15, wherein
the first transistor is a p type MOSFET.

* * * * *